(12) United States Patent
Yanagisawa

(10) Patent No.: US 8,921,133 B2
(45) Date of Patent: Dec. 30, 2014

(54) METHOD OF FORMING A SAMPLED GRATING AND METHOD OF PRODUCING A LASER DIODE

(75) Inventor: Masaki Yanagisawa, Yokohama (JP)

(73) Assignee: Sumitomo Electric Industries, Ltd, Osaka (JP)

( * ) Notice: Subject to any disclaimer, the term of this patent is extended or adjusted under 35 U.S.C. 154(b) by 287 days.

(21) Appl. No.: 13/535,677

(22) Filed: Jun. 28, 2012

(65) Prior Publication Data

US 2013/0011947 A1 Jan. 10, 2013

(30) Foreign Application Priority Data

Jul. 4, 2011 (JP) ................. 2011-148497

(51) Int. Cl.
| | |
|---|---|
| *H01L 21/00* | (2006.01) |
| *H01S 5/12* | (2006.01) |
| *H01S 5/20* | (2006.01) |
| *G02B 5/18* | (2006.01) |
| *B82Y 40/00* | (2011.01) |
| *G03F 7/00* | (2006.01) |
| *G03F 7/20* | (2006.01) |
| *H01S 5/343* | (2006.01) |
| *H01S 5/227* | (2006.01) |
| *H01S 5/22* | (2006.01) |

(52) U.S. Cl.
CPC ... *G02B 5/18* (2013.01); *H01S 5/12* (2013.01); *H01S 5/2086* (2013.01); *G03F 7/2059* (2013.01); *H01S 5/34306* (2013.01); *B82Y 40/00* (2013.01); *H01S 5/2275* (2013.01); *H01S 5/1231* (2013.01); *G03F 7/20* (2013.01); *H01S 5/1209* (2013.01); *G03F 7/00* (2013.01); *G03F 7/0002* (2013.01); *G02B 5/1857* (2013.01); *H01S 5/2224* (2013.01)
USPC .......................... 438/29; 257/E33.06; 216/24

(58) Field of Classification Search
CPC ........... G03F 7/00; G03F 7/20; G03F 7/2059; G03F 7/0002; H01S 5/12; H01S 5/2086; H01S 5/1231; H01S 5/1209; H01S 5/2275; H01S 5/34306; H01S 5/2224; G02B 5/18; G02B 5/1857; B82Y 10/00; B82Y 40/00
USPC ....................................... 438/29; 257/E33.06
See application file for complete search history.

(56) References Cited

U.S. PATENT DOCUMENTS

| | | | | |
|---|---|---|---|---|
| 7,851,240 | B2 * | 12/2010 | Yanagisawa | 438/29 |
| 2009/0053656 | A1 | 2/2009 | Yanagisawa | |

FOREIGN PATENT DOCUMENTS

| | | |
|---|---|---|
| CN | 101065647 A | 10/2007 |
| CN | 101614952 A | 12/2009 |

(Continued)

OTHER PUBLICATIONS

V. Jayaraman et al., "Widely tunable continuous-wave InGaAsP/InP sampled grating lasters", Electronics Letters, Sep. 1, 1994, vol. 30, No. 18, pp. 1492-1494.

(Continued)

*Primary Examiner* — Stephen W Smoot
*Assistant Examiner* — Vicki B Booker
(74) *Attorney, Agent, or Firm* — Smith, Gambrell & Russell, LLP

(57) ABSTRACT

A method of forming a sampled grating includes the steps of preparing a substrate; preparing a nano-imprinting mold including a pattern surface on which projections and recesses are periodically formed; preparing a mask including a light obstructing portion and a light transmitting portion that are alternately provided; forming a photoresist layer and a resin portion in that order on the substrate; forming a patterned resin portion having projections and recesses by pressing the pattern surface of the mold into contact with the resin portion and hardening the resin portion while maintaining the contact; exposing a portion of the photoresist layer by irradiating the photoresist layer with exposing light through the mask and the patterned resin portion; forming a patterned photoresist layer by developing the photoresist layer; and etching the substrate using the patterned photoresist layer.

8 Claims, 28 Drawing Sheets

(56) References Cited

FOREIGN PATENT DOCUMENTS

| | | |
|---|---|---|
| JP | 2009-53271 | 3/2009 |
| WO | 2006/037027 A1 | 4/2006 |

OTHER PUBLICATIONS

Stephen Y. Chou et al., "Imprint of sub-25 nm vias and trenched in polymers", Appl. Phys. Lett. 67(21), Nov. 20, 1995, pp. 3114-3116.

\* cited by examiner

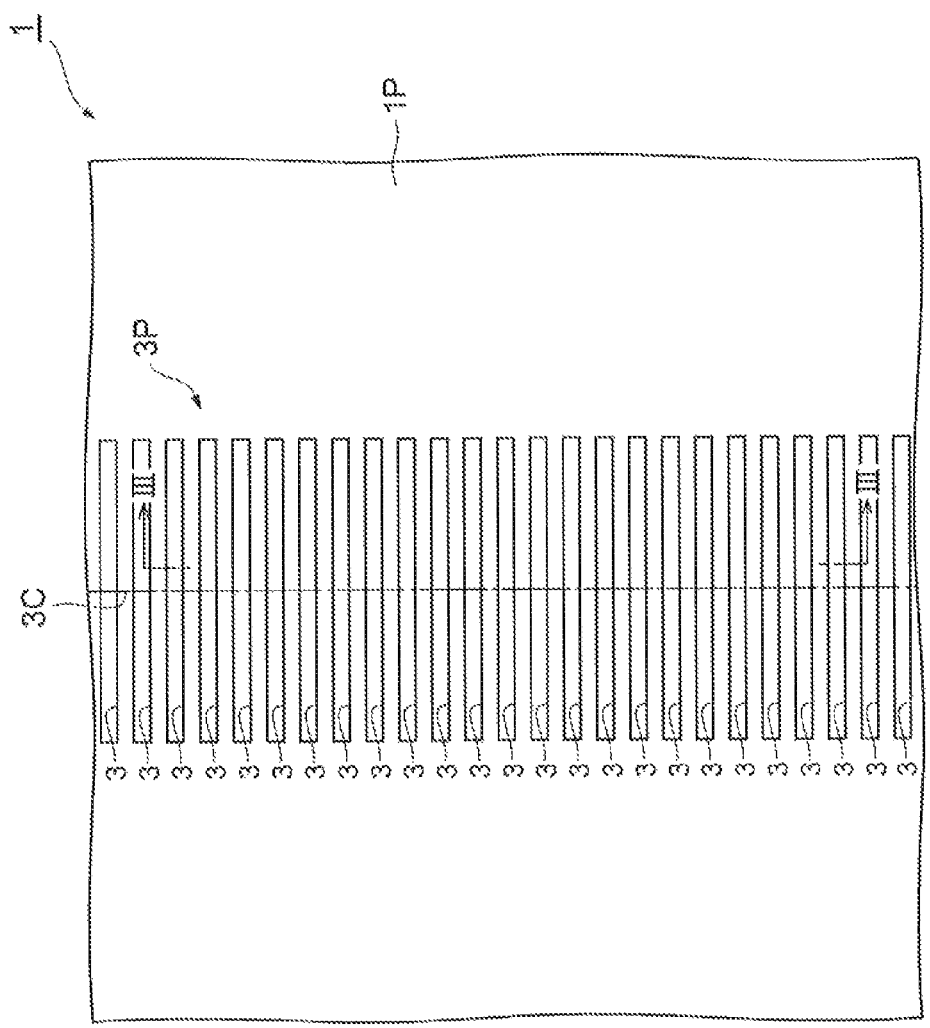
FIG. 2
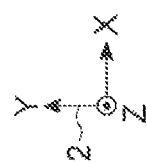

METHOD OF FORMING A SAMPLED GRATING AND METHOD OF PRODUCING A LASER DIODE

BACKGROUND OF THE INVENTION

1. Field of the Invention

The present invention relates to a method of forming a sampled grating and a method of producing a laser diode.

2. Description of the Related Art

Japanese Unexamined Patent Application Publication No. 2009-53271 (Patent Literature 1) describes a method of producing a distributed feedback laser diode using a nano-imprint technique. In this method, a pattern of a diffraction grating is formed in a semiconductor layer by the nano-imprint technique. In addition, Nonpatent Literature 1 (V. Jayaraman, et. al., "Widely tunable continuous-wave InGaAsP/InP sampled grating lasers", Electronics letters, Vol. 30, No. 18, pp. 1492-1494, (Sep. 1, 1994)) describes a distributed feedback laser diode including a sampled grating (SG).

SUMMARY OF THE INVENTION

As a method of forming a diffraction grating included in a laser diode, a method that uses the nano-imprint technique is being considered. By using the nano-imprint technique in forming the diffraction grating, it is possible to reduce production costs of devices, such as laser diodes.

When forming a diffraction grating by the nano-imprint technique, first, a resin layer is formed on a semiconductor layer on which the diffraction grating is to be formed. Then, a mold including a pattern having periodic projections and recesses in correspondence with the shape of the diffraction grating is pushed against the resin layer, and the resin layer is hardened in this state. This causes the pattern having projections and recesses of the mold to be transferred to the resin layer. Thereafter, by transferring the shape of the resin layer to the semiconductor layer, a fine structure is formed on the semiconductor layer.

However, in producing the distributed feedback laser diode including a sampled grating, the following problems exist when forming the sampled grating using the nano-imprint technique.

That is, the sampled grating has a structure in which portions where the diffraction grating is formed and portions where the diffraction grating is not formed are alternately provided periodically. For example, filter characteristics and coupling efficiency of the sampled grating change depending upon structural features of the sampled grating, such as periodic-direction lengths of the portions where the diffraction grating is formed (the number of recesses in the portions where the diffraction grating is formed), periodic-direction lengths of the portions where the diffraction grating is not formed, and the position of the portions where the diffraction grating is formed in a direction of a resonator.

However, when forming a plurality of sampled gratings by the nano-imprint technique, the plurality of sampled gratings that are formed using one mold all include the same pattern, so that they all have the same structure. Therefore, in order to form sampled gratings having various structures, a plurality of molds including patterns having projections and recesses corresponding to the various structures need to be prepared. In general, the mold is made of, for example, quartz. In addition, a fine pattern with high precision is formed on a surface of the mold by, for example, electron beam lithography. Therefore, production costs are relatively high, and the fabrication time is long.

A method of forming a sampled grating according to an aspect of the present invention includes the steps of preparing a substrate; preparing a nano-imprinting mold including a pattern surface on which projections and recesses are periodically formed; preparing a mask including a light obstructing portion and a light transmitting portion that are alternately provided in a first direction; forming a photoresist layer and a resin portion in that order on the substrate; forming a patterned resin portion having projections and recesses by pressing the pattern surface of the mold into contact with the resin portion and hardening the resin portion while maintaining the contact, the projections and recesses formed on the resin portion being provided in a second direction; exposing a portion of the photoresist layer by irradiating the photoresist layer with exposing light through the mask and the patterned resin portion; forming a patterned photoresist layer by developing the photoresist layer, the patterned photoresist layer including a pattern having projections and recesses formed on the portion of the photoresist layer; and etching the substrate using the patterned photoresist layer to form a first portion without a pattern having projections and recesses and second portion with a pattern having projections and recesses. In addition, in the step of exposing the portion of the photoresist layer, the photoresist layer includes a first area where the exposing light is obstructed by the light obstructing portion of the mask and a second area where the exposing light is transmitted through the light transmitting portion of the mask, and the second area of the photoresist layer is exposed to the exposing light that is transmitted through the recess in the resin portion. Furthermore, in the step of etching the substrate, the first portions and the second portions are alternately formed, the first portion corresponding to a shape of the first area of the photoresist layer, the second portion corresponding to a shape of the second area of the photoresist layer.

In the method of forming a sampled grating according to the present invention, in the step of preparing the mask, a plurality of masks may be prepared, each mask including a pattern having the light obstructing portion and the light transmitting portion that are alternately provided in the first direction, the plurality of masks having the different patterns from each other. In addition, in the step of exposing the portion of the photoresist layer, one of the masks selected from the plurality of masks may be used to expose the portion of the photoresist layer. Furthermore, each mask may include the light obstructing portion whose length differs from that of the light obstructing portion of each of the other masks along the first direction, or include the light transmitting portion whose length differs from that of the light transmitting portion of each of the other masks along the first direction.

In the method of forming a sampled grating according to the present invention, the length of each diffraction grating portion along a waveguiding direction in the sampled grating to be formed and the length of each portion without diffraction grating along the waveguide direction in the sampled grating to be formed can be controlled on the basis of the shape of the pattern of the light transmitting portions and the light-obstructing portion of the mask. More specifically, on the basis of, for example, the length of each light transmitting portion in the mask and the length from one light transmitting portion to another light transmitting portion that is adjacent thereto, it is possible to control the length of its corresponding diffraction grating portion in the sampled grating and the length of its corresponding portion without diffraction grating in the sampled grating. Therefore, if a plurality of masks that have different patterns from each other, are prepared, sampled gratings having a plurality of different structures can be formed using one type of mold. More specifically, if a plurality of masks, each including the light obstructing portion whose length differs from that of the light obstructing portion of each of the other masks, or including the light transmitting portions whose lengths differ from those of the light transmitting portions of each of the other masks, are prepared, sampled gratings having a plurality of different structures can be formed using one type of mold. The production costs of masks are, in general, approximately less than or equal to one-tenth of the production costs of molds. Therefore, according to the method of forming a sampled grating according to the present invention, various forms of sampled gratings can be formed at a low cost.

Further, in the method of forming a sampled grating according to the present invention, the step of exposing the portion of the photoresist layer preferably includes a step of adjusting a relative position between the mask and the resin portion so that, after the photoresist layer and the mask are caused to oppose each other, the first direction of the mask is parallel to the second direction of the resin portion.

In the method of forming a sampled grating according to the present invention, deviations of the practical diffraction grating period and of the number of recesses in each diffraction grating portion of the sampled grating from the desired values, respectively are suppressed.

Further, in the method of forming a sampled grating according to the present invention, the resin portion may be formed of thermoplastic resin or thermosetting resin. In the step of forming the patterned resin portion, the pattern having the projections and recesses of the mold may be transferred to the resin portion by a thermal nano-imprinting method.

Further, in the method of forming a sampled grating according to the present invention, the resin portion may be formed of ultraviolet curing resin. In the step of forming the photoresist layer and the resin portion, a light shield layer may be further formed between the photoresist layer and the resin portion. In addition, in the step of forming the patterned resin portion, the pattern having the projections and recesses of the mold is transferred to the resin portion by an optical nano-imprinting method. The method may further include the step of forming a patterned light shield layer having projections and recesses by etching the light shield layer with the patterned resin portion serving as a mask. In the step of exposing the portion of the photoresist layer, the portion of the photoresist layer may be exposed by irradiating the photoresist layer with the exposing light through the mask, the patterned resin portion, and the patterned light shield layer.

The light shield layer formed on the photoresist layer reflects and/or absorbs ultraviolet (UV) rays. Therefore, when forming the pattern having projections and recesses on the resin portion, it is possible to prevent exposure of the photoresist layer to the ultraviolet rays. Consequently, it is possible to suitably form the pattern having projections and recesses on the resin portion by an optical nano-imprinting method. In addition, it is possible to suitably expose a portion of the photoresist layer by etching the light shield layer with the patterned resin portion serving as a mask to form a patterned light shield layer, and, then, by irradiating the photoresist layer with the exposing light through the mask, the patterned resin portion, and the patterned light shield layer.

Further, in the method of forming a sampled grating according to the present invention, in the step of forming the photoresist layer and the resin portion on the substrate, a transferring layer may be formed between the substrate and the photoresist layer, the transferring layer being formed of a dielectric film. The method may further include the step of forming a patterned transferring layer having projections and recesses by etching the transferring layer with the patterned photoresist layer serving as a mask. In addition, in the step of etching the substrate, the substrate may be etched using the patterned transferring layer.

Further, in the method of forming a sampled grating according to the present invention, the step of preparing the substrate may include the step of forming a stacked semiconductor layer on the substrate, the stacked semiconductor layer including a semiconductor layer on which the sampled grating is formed.

A method of producing a laser diode according to another aspect of the present invention includes the steps of forming a stacked semiconductor layer on a substrate, the stacked semiconductor layer including an active layer and a semiconductor layer for forming a sampled grating thereon; forming the sampled grating on the semiconductor layer; forming an embedding layer on the sampled grating; and forming an electrode for injecting current into the active layer. The step of forming the sampled grating includes the steps of preparing a nano-imprinting mold including a pattern surface on which projections and recesses are periodically formed; preparing a mask including a light obstructing portion and a light transmitting portion that are alternately provided in a first direction; forming a photoresist layer and a resin portion in that order on the substrate; forming a patterned resin portion having projections and recesses by pressing the pattern surface of the mold into contact with the resin portion and hardening the resin portion while maintaining the contact, the projections and recesses formed on the resin portion being provided in a second direction; exposing a portion of the photoresist layer by irradiating the photoresist layer with exposing light through the mask and the patterned resin portion; forming a patterned photoresist layer by developing the photoresist layer, the patterned photoresist layer including a pattern having projections and recesses formed on the portion of the photoresist layer; and etching the substrate using the patterned photoresist layer to form a first portion without a pattern having projections and recesses and second portion with a pattern having projections and recesses. In addition, in the step of exposing the portion of the photoresist layer, the photoresist layer includes a first area where the exposing light is obstructed by the light obstructing portion of the mask and a second area where the exposing light is transmitted through the light transmitting portion of the mask, and the second area of the photoresist layer is exposed to the exposing light that is transmitted through the recess in the resin portion. In the step of etching the substrate, the first portions and the second portions are alternately formed, the first portion corresponding to a shape of the first area of the photoresist layer, the second portion corresponding to a shape of the second area of the photoresist layer.

In the method of producing a laser diode according to the present invention, since the sampled grating is formed by the above-described forming method, sampled gratings having various structures can be formed at a low cost. Therefore, according to the method of producing a laser diode according to the present invention, laser diodes including sampled gratings having various structures can be produced at a low cost.

BRIEF DESCRIPTION OF THE DRAWINGS

FIG. 2 is an enlarged plan view of a mold area shown in FIG. 1.

DESCRIPTION OF THE PREFERRED EMBODIMENTS

Figure 1:
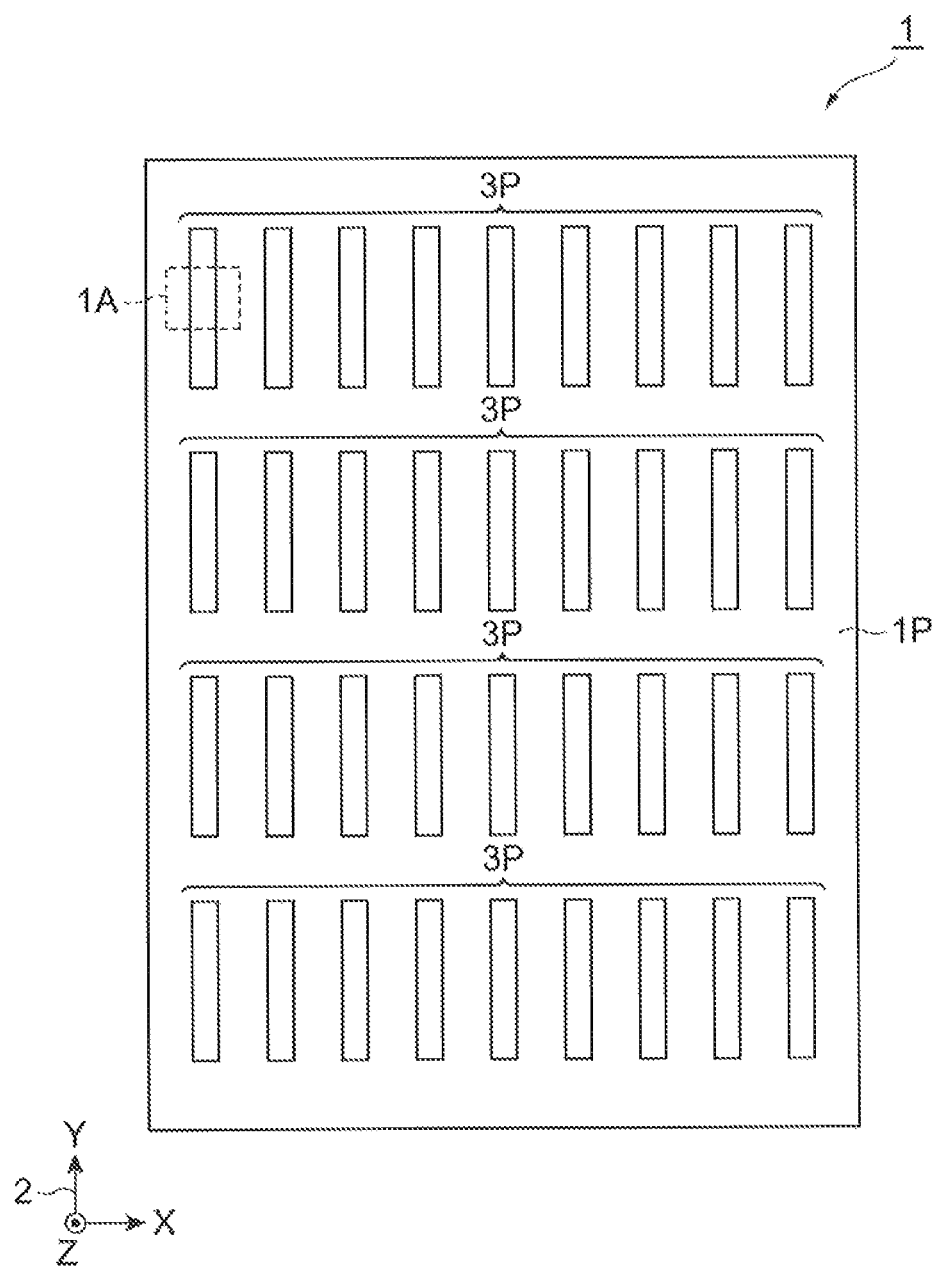
FIG. 1 is a plan view of a mold that is prepared in a mold preparing step.

Methods of forming a sampled grating and methods of producing a laser diode according to embodiments will be described in detail below with reference to the attached drawings. In the figures, corresponding components are given the same reference numerals to the extent possible. For making it easier to see the drawings, the dimensional proportions in structural components and between the structural components in the figures are arbitrarily set.

First Embodiment

A method of producing a laser diode according to a first embodiment includes a step of depositing a stacked semiconductor layer on a semiconductor substrate (stacked semiconductor layer forming step), a step of forming a sampled grating on a semiconductor layer in the stacked semiconductor layer (sampled grating forming step), a mesa portion forming step, and an electrode forming step. In the step of forming the sampled grating, the sampled grating is formed by a method of forming a sampled grating according to the first embodiment. The method of forming the sampled grating according to the first embodiment includes a mold preparing step, a mask preparing step, a resin portion forming step, a nano-imprinting step, a partial exposing step, a developing step, and a photoresist layer transferring step. Each of these steps will be described in detail below.

Mold Preparing Step

Figure 3:
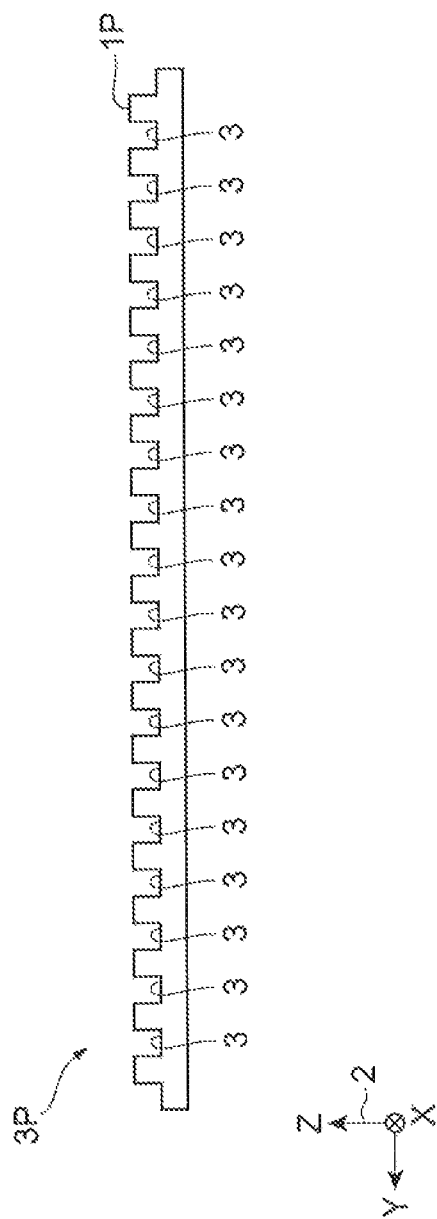
FIG. 3 is a sectional view taken along line III-III of the mold shown in FIG. 2.

First, the step of preparing a mold 1 (mold preparing step) is performed. FIG. 1 is a plan view of the mold 1 that is prepared in the mold preparing step. FIG. 2 is an enlarged plan view of a mold area 1A shown in FIG. 1. FIG. 3 is a sectional view taken along line III-III of the mold 1 shown in FIG. 2.

As shown in FIG. 1, the mold 1 for nano-imprinting that is prepared in this step is a flat plate having a substantially flat pattern surface 1P. The mold 1 for nano-imprinting is formed of, for example, quartz or silicone resin. In FIG. 1, a rectangular coordinate system 2 is shown. In the rectangular coordinate system 2, a Z axis is set in a thickness direction of the mold 1, and an X axis and a Y axis are set parallel to the pattern surface 1P. In FIG. 2 and the following figures, the rectangular coordinate system 2 is shown, if necessary.

As shown in FIG. 1, a plurality of line-and-space patterns (patterns having periodic projections and recesses) 3P are formed on the pattern surface 1P of the mold 1 according to the first embodiment. The plurality of line-and-space patterns 3P are formed in, for example, four rows and nine columns as shown in FIG. 1. As shown in FIGS. 2 and 3, a plurality of recesses 3 that are recessed in a negative direction of the Z axis and that extend along the X axis are provided in the pattern surface 1P. These plurality of recesses 3 define the respective line-and-space patterns 3P. In the pattern surface 1P, the plurality of recesses 3 are periodically provided along the Y axis. That is, in the pattern surface 1P, the plurality of recesses 3 are periodically provided along a direction 3C that is parallel to the Y axis.

A plurality of line portions of each line-and-space pattern 3P have substantially the same shape and extend along the X axis. The cross-sectional shape of each line portion along a YZ plane is substantially rectangular. The plurality of recesses 3 that become a plurality of spaces of each line-and-space pattern 3P have substantially the same shape, and extend along the X axis. The cross-sectional shape of each recess 3 along the YZ plane is substantially rectangular.

The shape of each line-and-space pattern 3P is in correspondence with the shape of a plurality of recesses 21D in each diffraction grating portion 21B of a sampled grating 21P (described below) (see FIG. 18). The period in which the plurality of recesses 3 are provided is substantially equal to the period in which the plurality of recesses 21D in each diffraction grating portion 21B of the sampled grating 21P (described below) (see FIG. 18) are provided. Here, one period of the plurality of recesses 3 is equivalent to the sum of the width of one line portion of each line-and-space pattern 3P along the Y axis direction and the width of one recess 3 along the Y axis direction.

Mask Preparing Step

Figure 4:
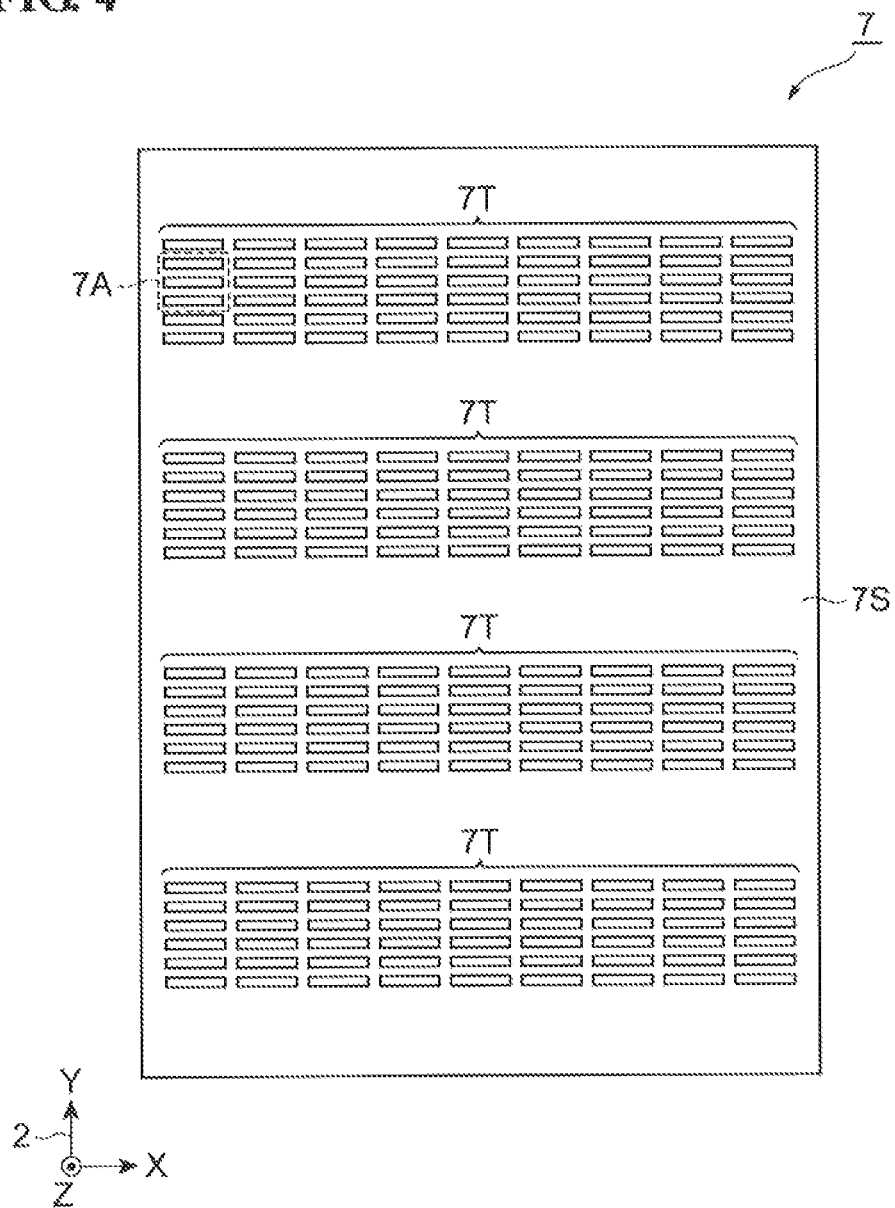
FIG. 4 is a plan view of a mask that is prepared in a mask preparing step.
Figure 5:
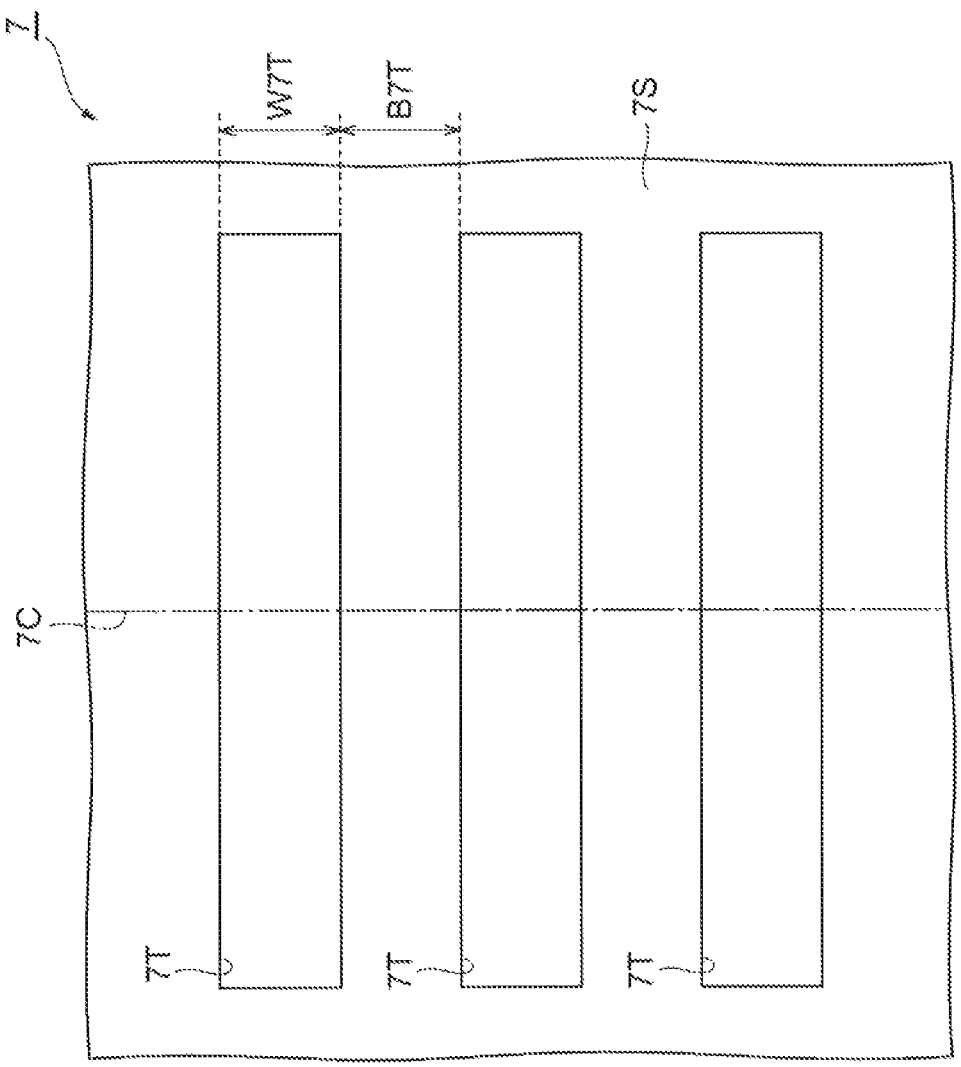
FIG. 5 is an enlarged plan view of a mask area shown in FIG. 4.

Next, the mask preparing step is performed. FIG. 4 is a plan view of a mask 7 that is prepared in the mask preparing step. FIG. 5 is an enlarged plan view of an area 7A of the mask 7 shown in FIG. 4.

As shown in FIGS. 4 and 5, the mask 7 that is prepared in this step is a flat plate having a substantially flat surface. In FIGS. 4 and 5, the Z axis is set in a thickness direction of the mask 7. The X axis and the Y axis are set parallel to the surface of the mask 7. The mask 7 includes a light obstructing portion 7S and a plurality of light transmitting portions 7T provided at the light obstructing portion 7S. The light obstructing portion 7S is an area for obstructing light propagating along the Z axis direction. The light transmitting portion 7T is an area for transmitting therethrough the light propagating along the Z axis direction.

The plurality of light transmitting portions 7T are periodically provided in a surface of the mask 7 along a direction parallel to the Y axis. That is, the plurality of light transmitting portions 7T are periodically provided in the surface of the mask 7 along a direction 7C that is parallel to the Y axis. A width W7T of the light transmitting portions 7T along the direction 7C is less than a length of the line-and-space patterns 3P of the mold 1 along the direction 3C. In addition, the width W7T of the light transmitting portions 7T is greater than a width of the recesses 3 of the mold 1 in the direction 3C (see FIGS. 1 and 2). A length B7T along the direction 7C between one light transmitting portion 7T and another light transmitting portion 7T adjacent thereto is less than the length of the line-and-space patterns 3P of the mold 1 along the direction 3C. Further, the length B7T is greater than the width of the recesses 3 of the mold 1 along the direction 3C (see FIGS. 1 and 2). The period of the plurality of light transmitting portions 7T in the direction 7C is greater than the period of the plurality of recesses 3 of the mold 1 in the direction 3C (see FIG. 2). Still further, the light obstructing portion 7S and the light transmitting portions 7T are alternately disposed at the surface of the mask 7 along the direction 7C in a period that is equivalent to the sum of the length B7T between adjacent light transmitting portions 71 and the width W7T of the corresponding light transmitting portion 7T (B7T+W7T).

In the first embodiment, the width W7T of each light transmitting portion 7T is in correspondence with the length of each diffraction grating portion 21B of the sampled grating 21P (described later) along the Y axis direction. On the other hand, the length B7T is in correspondence with the length of each portion without diffraction grating 21A of the sampled grating 21P (described later) along the Y axis direction. The length of each light transmitting portion 7T along the X axis direction is longer than the length of each recess 3 of the mold 1 along the X axis direction.

Each light transmitting portion 7T according to the first embodiment is an opening. Each light transmitting portion 7T may be formed of a material, such as quart, that allows light LE (see FIG. 14) used for exposure (described later) to be transmitted therethrough. On the other hand, the light obstructing portion 7S is formed of a material, such as chromium oxide, that essentially cannot transmit the light LE (see FIG. 14) used for the exposure (described later).

In the mask preparing step, a plurality of masks 7 each including light transmitting portions 7T and a light obstructing portion 7S whose shapes differ from those of the other masks 7 are prepared. That is, a plurality of masks 7 having different types of structures are prepared. For example, the widths W7T of the light transmitting portions 7T along the direction 7C, the lengths B7T from one light transmitting portion 7T to another light transmitting portion 7T that is adjacent thereto, and the periods of the light transmitting portions 7T in the direction 7C of the different types of structures differ from one another.

Stacked Semiconductor Layer Forming Step

Figure 6:
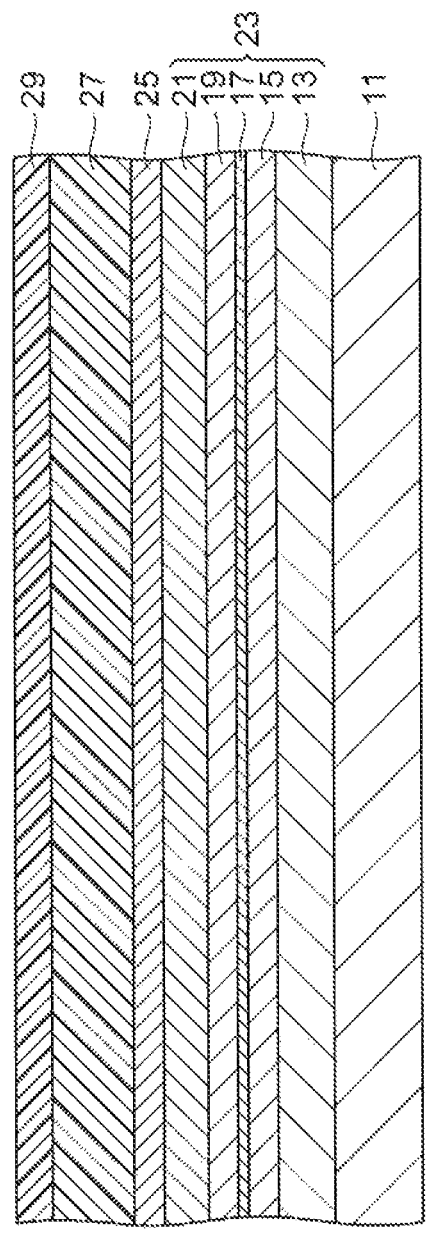
FIG. 6 is a sectional view illustrating a stacked semiconductor layer forming step and a resin portion forming step.

Next, a stacked semiconductor layer forming step is performed. FIG. 6 is a sectional view illustrating a stacked semiconductor layer forming step and a resin portion forming step, which is the next step. In the stacked semiconductor layer forming step, first, a stacked semiconductor layer 23 for forming a laser diode is deposited on a main surface of a semiconductor substrate 11. More specifically, as shown in FIG. 6, a lower cladding layer 13, a lower optical confinement layer 15, an active layer 17, an upper optical confinement layer 19, and a semiconductor layer 21 are deposited in that order on the semiconductor substrate 11 by, for example, an epitaxial growth method such as a metal-organic vapor phase epitaxy (MOVPE). The semiconductor substrate 11, the lower cladding layer 13, the lower optical confinement layer 15, the active layer 17, the upper optical confinement layer 19, and the semiconductor layer 21 constitute the stacked semiconductor layer 23.

As shown in FIG. 6 and the following figures, the Z axis of the rectangular coordinate system 2 is set in a thickness direction of the semiconductor substrate 11. On the other hand, the X axis and the Y axis are set in a direction that is parallel to the main surface of the semiconductor substrate 11. The main surface and a back surface of the semiconductor substrate 11 are planar surfaces that are substantially parallel to an XY plane. A direction in which the lower cladding layer 13, the lower optical confinement layer 15, the active layer 17, the upper optical confinement layer 19, and the semiconductor layer 21 are stacked is along the Z axis.

The semiconductor substrate 11 is a first conductivity type (such as a n-type) semiconductor substrate. The semiconductor substrate 11 is formed of, for example, a III-V group compound semiconductor containing, for example, indium phosphide (InP). The lower cladding layer 13 is formed of a first conductivity type, III-V group compound semiconductor containing, for example, InP. The lower optical confinement layer 15 is formed of a first conductivity type, III-V group compound semiconductor containing, for example, gallium indium arsenide phosphide (GaInAsP). The active layer 17 may have, for example, a multi quantum well (MQW) structure or a single quantum well (SQW) structure. The active layer 17 is formed of a III-V group compound semiconductor containing, for example, GaInAsP or aluminum gallium indium arsenide (AlGaInAs). The upper optical confinement layer 19 is formed of a second conductivity type, III-V group compound semiconductor containing, for example, GaInAsP. (The second conductivity type is a p-type if the first conductivity type is an n-type). The semiconductor layer 21 is formed of a second conductivity type, III-V group compound semiconductor containing, for example, GaInAsP. The sampled grating 21P (see FIG. 18) is formed on the semiconductor layer 21. The stacked semiconductor layer 23 need not include the lower optical confinement layer 15 and the upper optical confinement layer 19.

Resin Portion Forming Step

Next, a resin portion forming step is performed. As shown in FIG. 6, a transferring layer 25, a photoresist layer 27, and a resin portion 29 are formed in that order on the semiconductor layer 21.

The transferring layer 25 is formed of, for example, a dielectric film such as silicon nitride (SiN) or silicon oxynitride (SiON). The transferring layer 25 is formed by, for example, a chemical vapor deposition (CVD) method. In the first embodiment, the photoresist layer 27 is a positive photoresist. The resin portion 29 is formed of thermoplastic resin, such as polymethylmethacrylate (PMMA), or thermosetting resin, such as polyethylene terephthalate (PET). The photoresist layer 27 and the resin portion 29 may be formed by, for example, coating. In the present step, the transferring layer 25 need not be formed.

Nano-Imprinting Step

Figure 7:
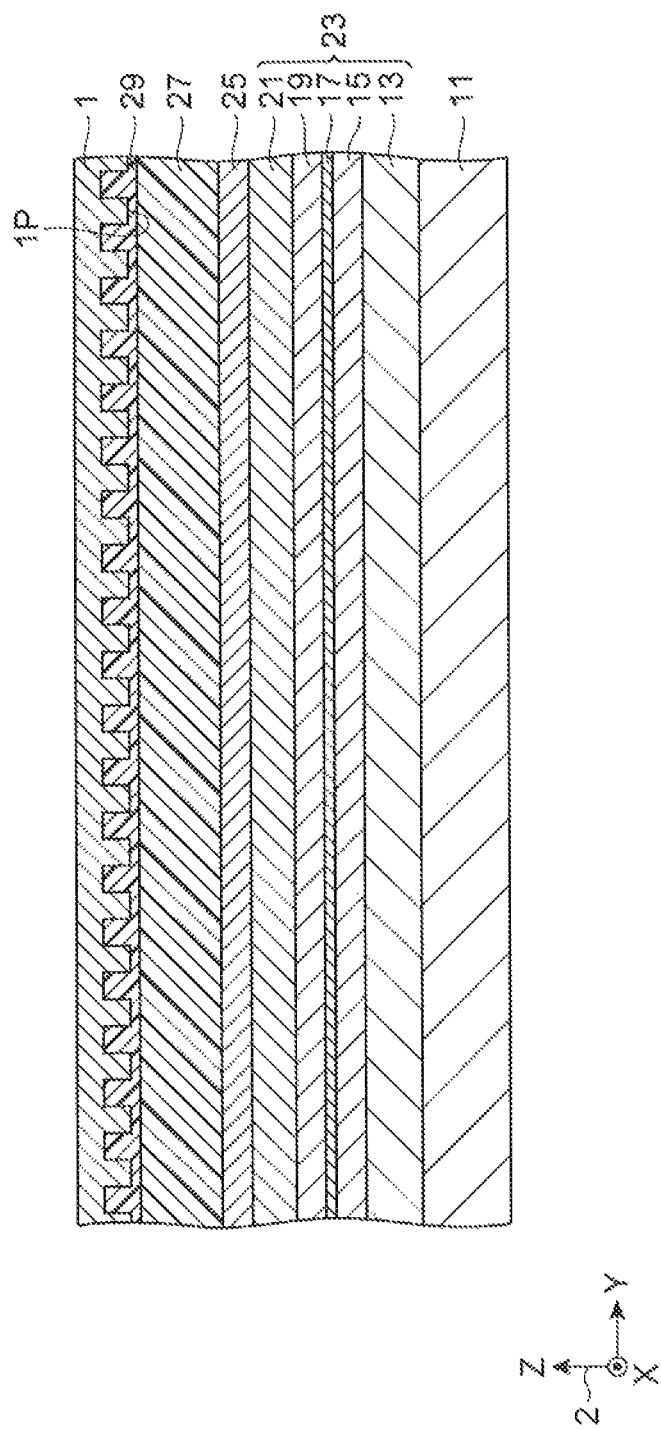
FIG. 7 is a sectional view illustrating a nano-imprinting step.
Figure 8:
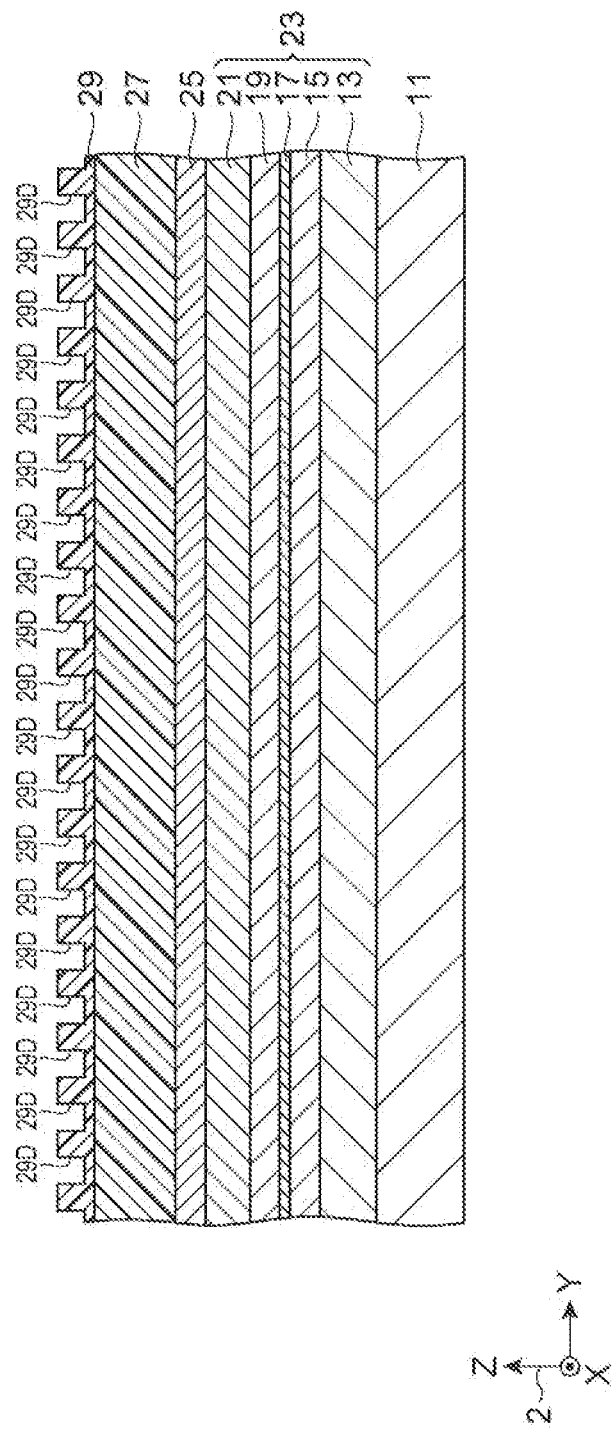
FIG. 8 is a sectional view illustrating the nano-imprinting step.
Figure 9:
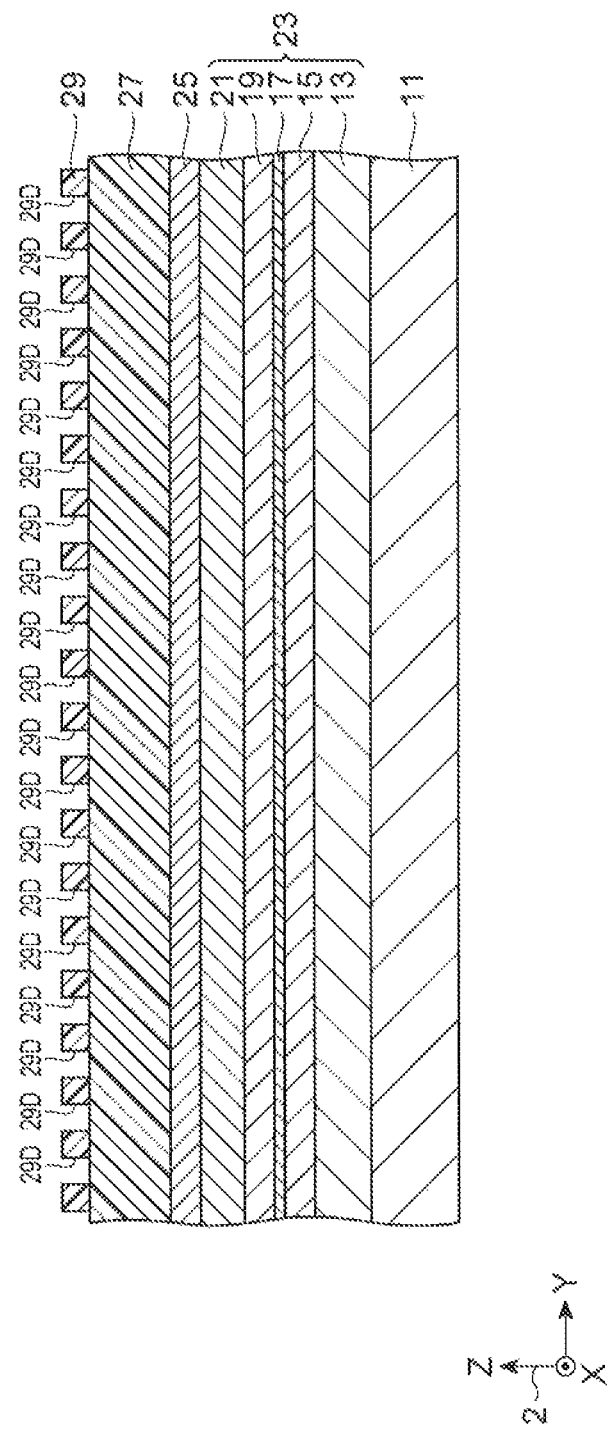
FIG. 9 is a sectional view illustrating the nano-imprinting step.
Figure 10:
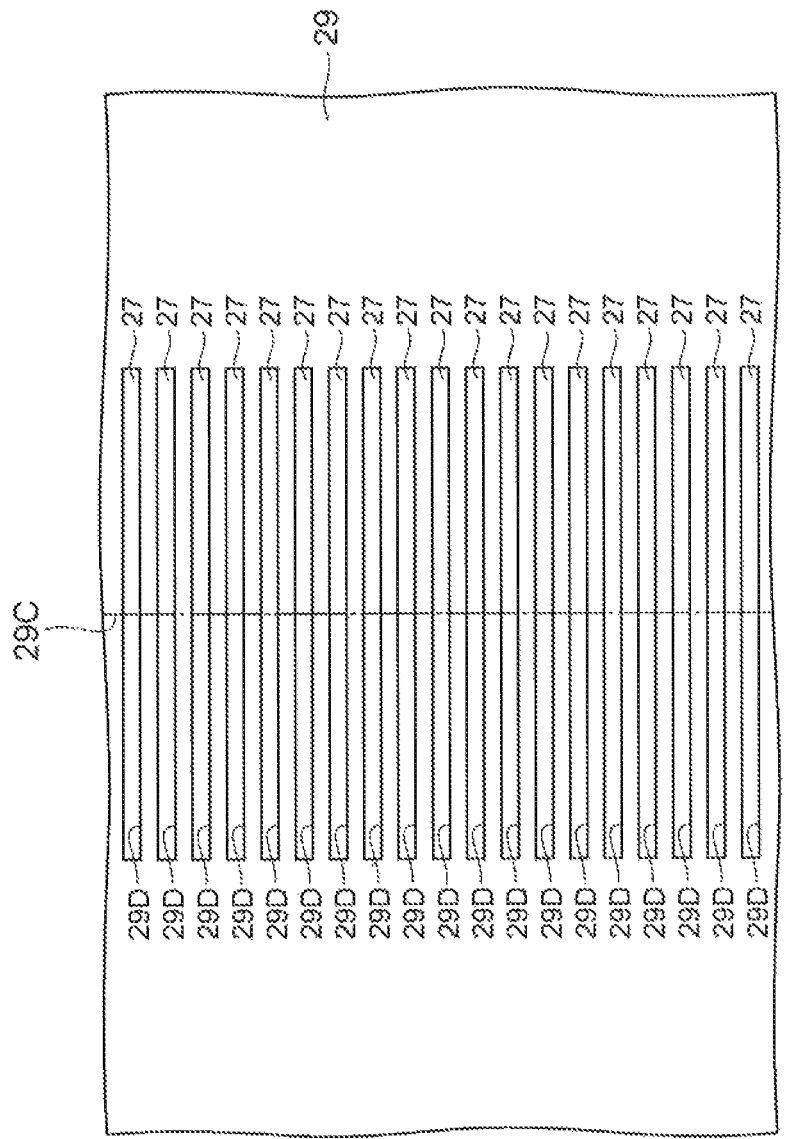
FIG. 10 is a plan view illustrating the nano-imprinting step.

Next, a nano-imprinting step is performed. FIGS. 7 to 9 are each a sectional view illustrating the nano-imprinting step. FIG. 10 is a plan view illustrating the nano-imprinting step.

In this step, the shapes of the plurality of recesses 3 of the mold 1 are transferred to the resin portion 29 by a thermal nano-imprinting method. More specifically, first, when the resin portion 29 is formed of thermoplastic resin, the resin portion 29 is heated to a temperature that is greater than or equal to its melting point or its glass-transition temperature, to soften the resin portion 29. When the resin portion 29 is formed of thermosetting resin, it is not necessary to perform the heating.

Next, as shown in FIG. 7, the pattern surface 1P of the mold 1 is pressed against the resin portion 29, to bring the pattern surface 1P into contact with the resin portion 29. While keeping the pattern surface 1P of the mold 1 pushed against and in contact with the resin portion 29, the resin portion 29 is hardened. When the resin portion 29 is formed of thermoplastic resin, the resin portion 29 can be hardened by cooling the resin portion 29 to a temperature that is less than or equal to its melting point or its glass-transition temperature. On the other hand, when the resin portion 29 is formed of thermosetting resin, the resin portion 29 can be hardened by heating the resin portion 29 to a temperature that is greater than or equal to its polymerization temperature.

Next, as shown in FIG. 8, the mold 1 is detached from the resin portion 29. This causes an inverted shape of the pattern surface 1P of the mold 1 to be transferred to resin portion 29. That is, a plurality of recesses 29D are formed in the resin portion 29. Line-and-space patterns having the inverted shape of the pattern surface 1P of the mold 1 are defined by the plurality of recesses 29D.

Next, as shown in FIG. 9, by, for example, a reactive ion etching (RIE) method using oxygen ($O_2$) gas, the resin portion 29 is etched so that the plurality of recesses 29D reach the photoresist layer 27. At this time, the surface of the photoresist layer 27 is exposed at the plurality of recesses 29D.

FIG. 10 is a plan view of, for example, the resin portion in the state shown in FIG. 9. As shown in FIG. 10, the plurality of recesses 29D define the line-and-space patterns having the inverted shape of the pattern surface 1P of the mold 1. Therefore, the plurality of recesses 29D are recessed towards a –Z axis, and extend along the X axis. The plurality of recesses 29D are periodically provided along the Y axis in the surface of the resin portion 29. That is, the plurality of recesses 29D are periodically provided in the surface of the resin portion 29 along a direction 29C that is parallel to the Y axis.

Partial Exposing Step

Figure 11:
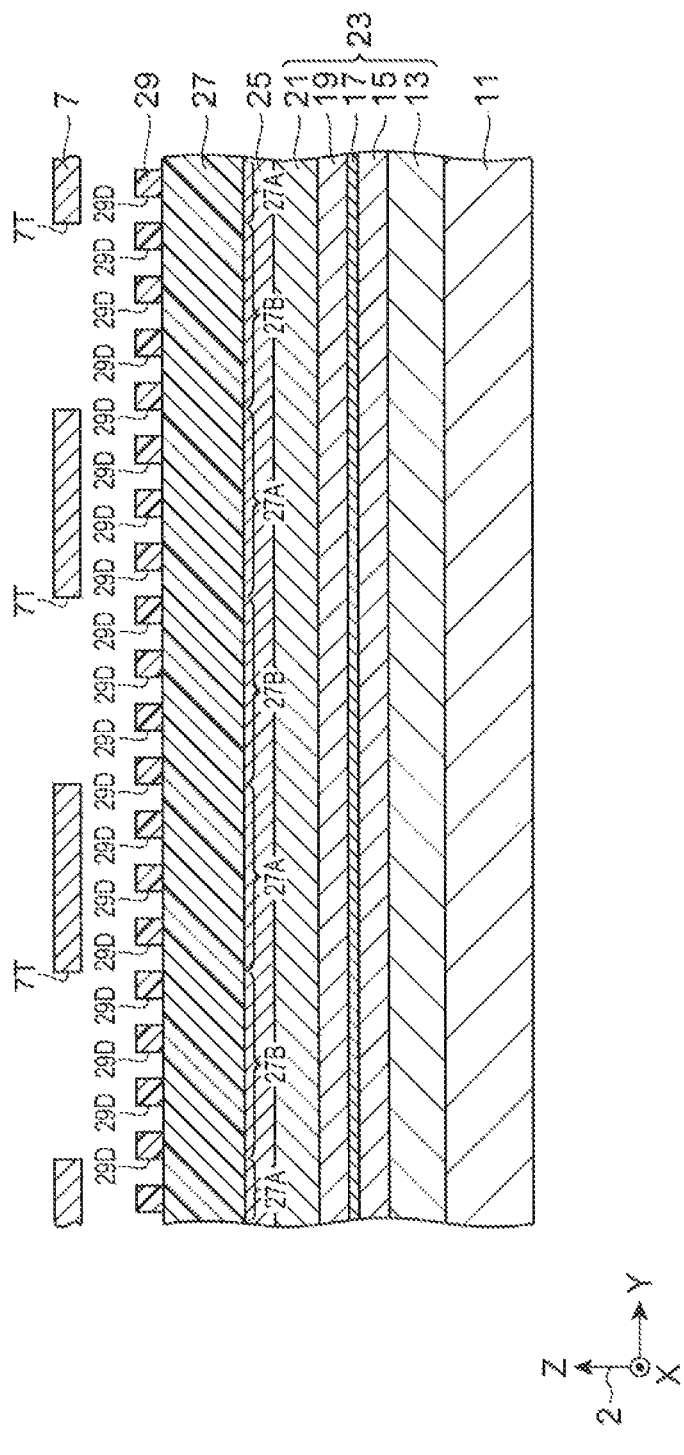
FIG. 11 is a sectional view illustrating a partial exposing step.
Figure 12:
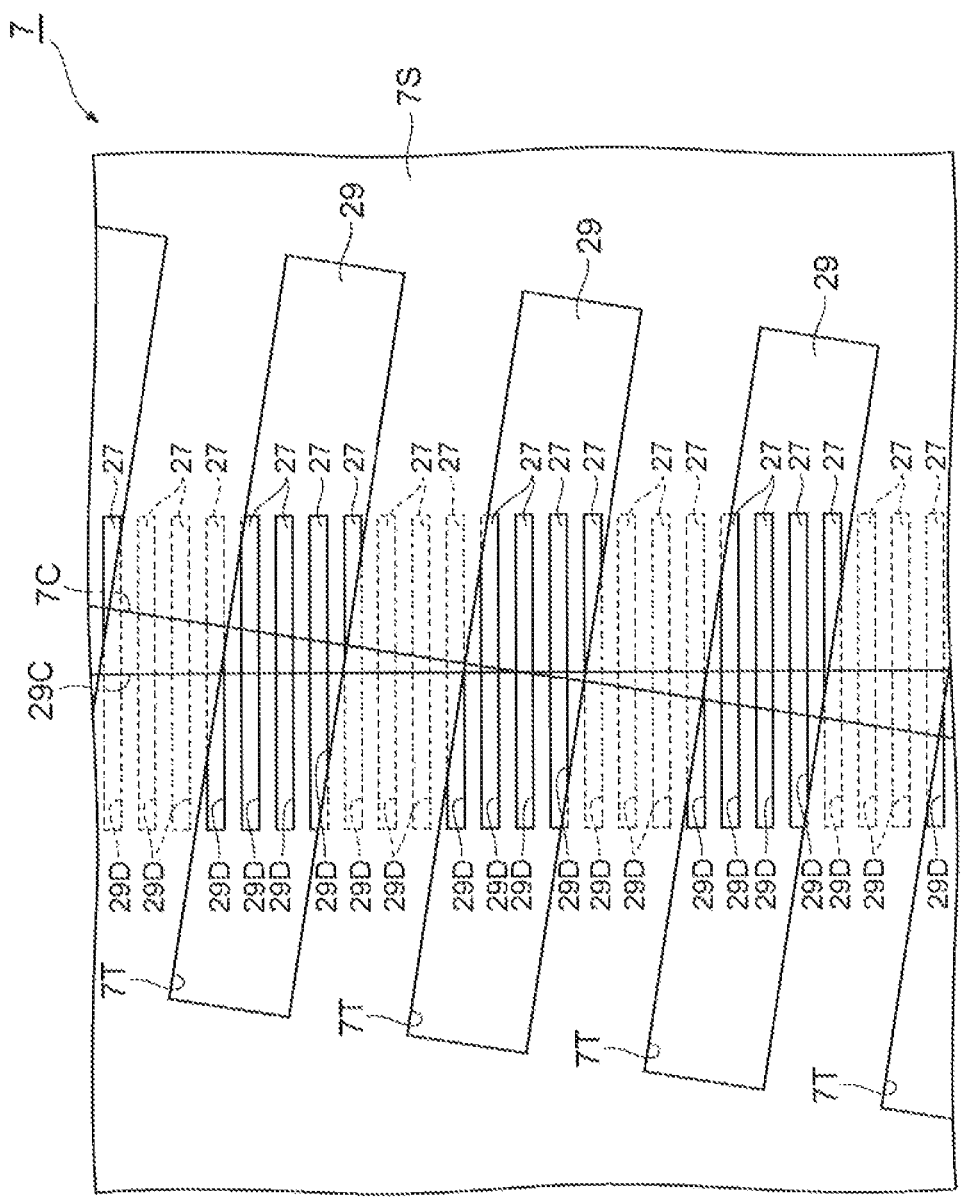
FIG. 12 is a plan view illustrating an adjusting step.
Figure 13:
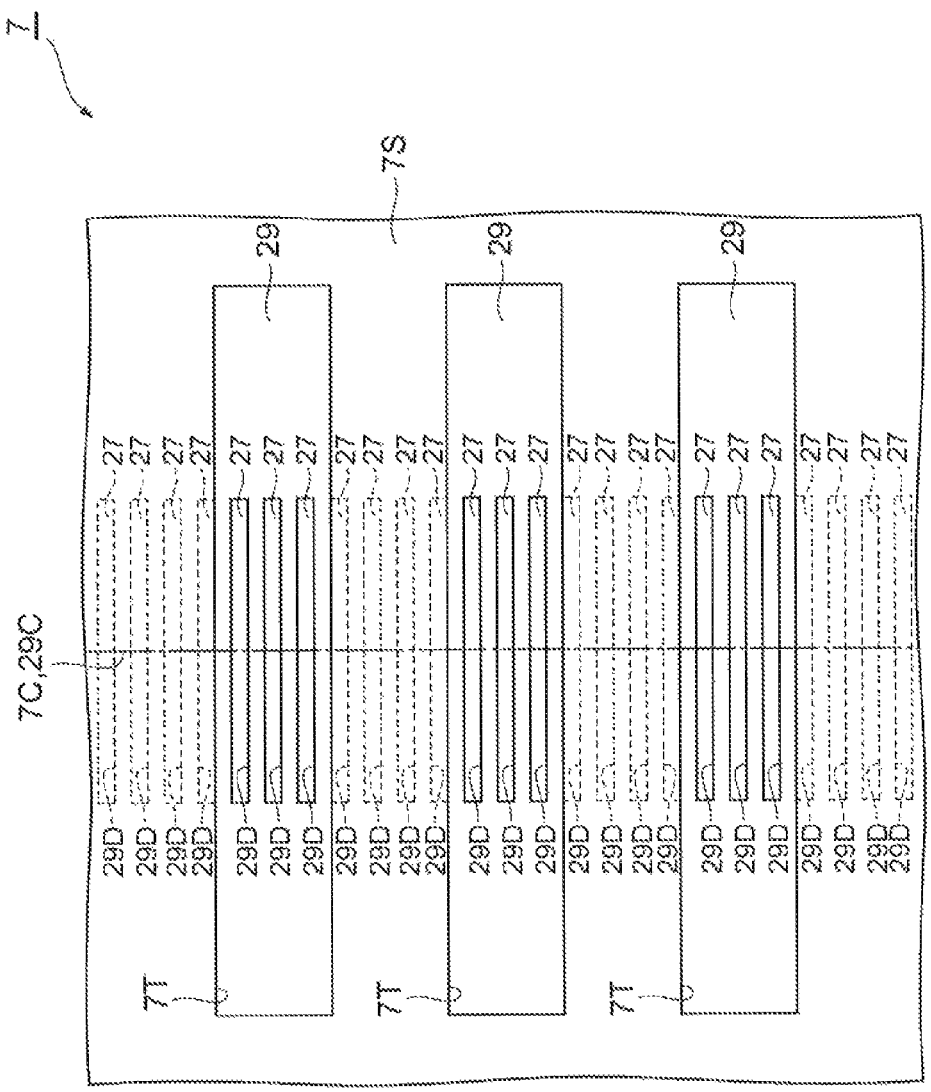
FIG. 13 is a plan view illustrating the adjusting step.
Figure 14:
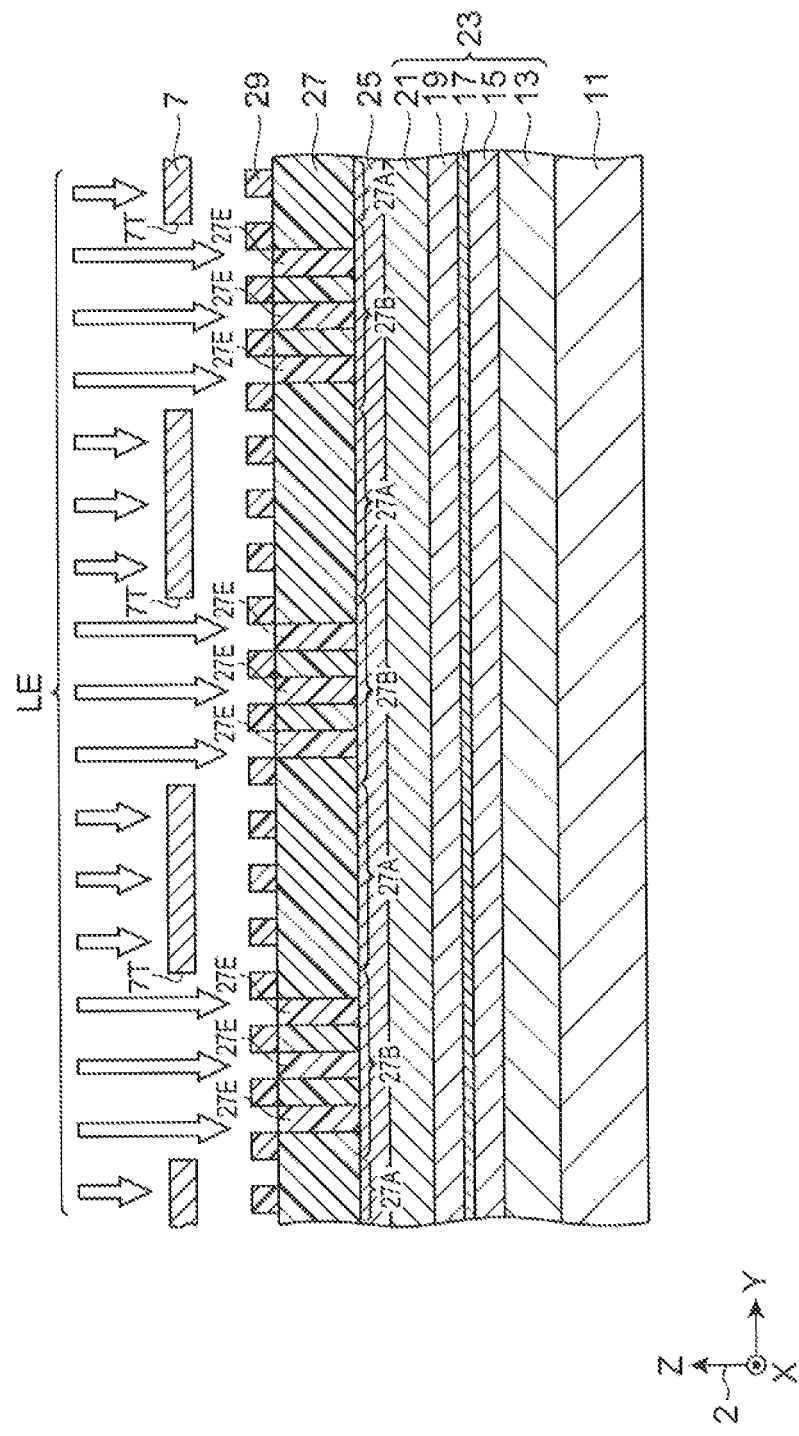
FIG. 14 is a sectional view illustrating the partial exposing step.

Next, a partial exposing step is performed. FIGS. 11 and 14 are sectional views illustrating the partial exposing step. FIGS. 12 and 13 are plan views illustrating an adjusting step which can be performed in the partial exposing step.

In the partial exposing step, first, as shown in FIG. 11, the photoresist layer 27 and the surface of the mask 7 are caused to oppose each other through the resin portion 29. Thereafter, the adjusting step can be performed. FIGS. 12 and 13 are plan views showing a state in which the photoresist layer and the mask oppose each other. As shown in FIG. 12, in the state in which the photoresist layer 27 and the surface of the mask 7 oppose each other, the direction 7C of the light transmitting portions 7T of the mask 7 and the direction 29C of the plurality of recesses 29D of the resin portion 29 may not be parallel to each other. In this case, as shown in FIG. 13, the relative position between the mask 7 and the resin portion 29 can be adjusted so that the direction 7C of the light transmitting portions 7T of the mask 7 is parallel or approaches a direction that is parallel to the direction 29C of the plurality of recesses 29D of the resin portion 29.

As shown in FIG. 13, in the state in which the photoresist layer 27 and the surface of the mask 7 oppose each other, as seen from the Z axis direction, each light transmitting portion 7T of the mask 7 overlaps at least one (three, in the first embodiment) of the recesses 29D. As shown in FIG. 11, this causes first areas 27A of the photoresist layer 27 to be covered by the mask 7. In contrast, second areas 27B of the photoresist layer 27 are not covered by the mask 7. That is, in this step, the photoresist layer 27 includes the first areas 27A and the second areas 27B. At this time, the first areas 27A correspond to portions of the light obstructing portion 7S of the mask 7, and the second areas 27B correspond to the light transmitting portions 7T of the mask 7.

Next, as shown in FIG. 14, the photoresist layer 27 is irradiated with the exposing light LE through the mask 7. The exposing light LE is transmitted through the plurality of recesses 29D, and reaches the photoresist layer 27. As a result, among the second areas 27B of the photoresist layer 27, areas 27E that are below the plurality of recesses 29D of the resin portion 29 are exposed. Here, of the photoresist layer 27, the first areas 27A are not exposed because light is blocked by the light obstructing portion 7S of the mask 7. Of the second areas 27B, areas that are covered by the resin portion 29 are not exposed because light is blocked by the resin portion 29.

Developing Step

Figure 15:
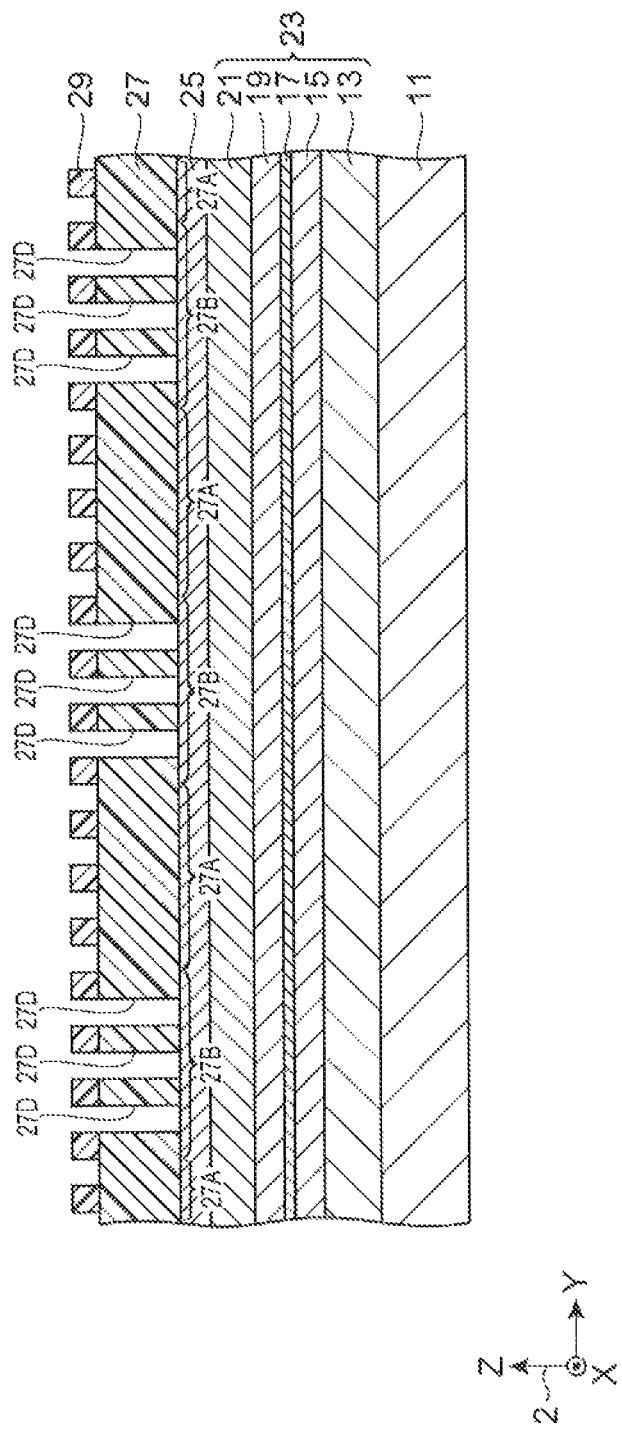
FIG. 15 is a sectional view illustrating a developing step.

Next, a developing step is performed. FIG. 15 is a sectional view illustrating the developing step. In this step, as shown in FIG. 15, the photoresist layer 27 is developed by an alkali developer. This causes a plurality of recesses 27D to be formed in the second areas 27B of the photoresist layer 27. As a result, patterns having non-inverted shapes of the resin portion 29 are transferred to the second areas 27B of the photoresist layer 27. At this time, the plurality of recesses 27D are formed in the second areas 27B. The plurality of recesses 27D define line-and-space patterns in the second areas 27B. The patterns that are defined by the recesses are not formed in the first areas 27A of the photoresist layer 27.

Photoresist Layer Transferring Step

Figure 16:
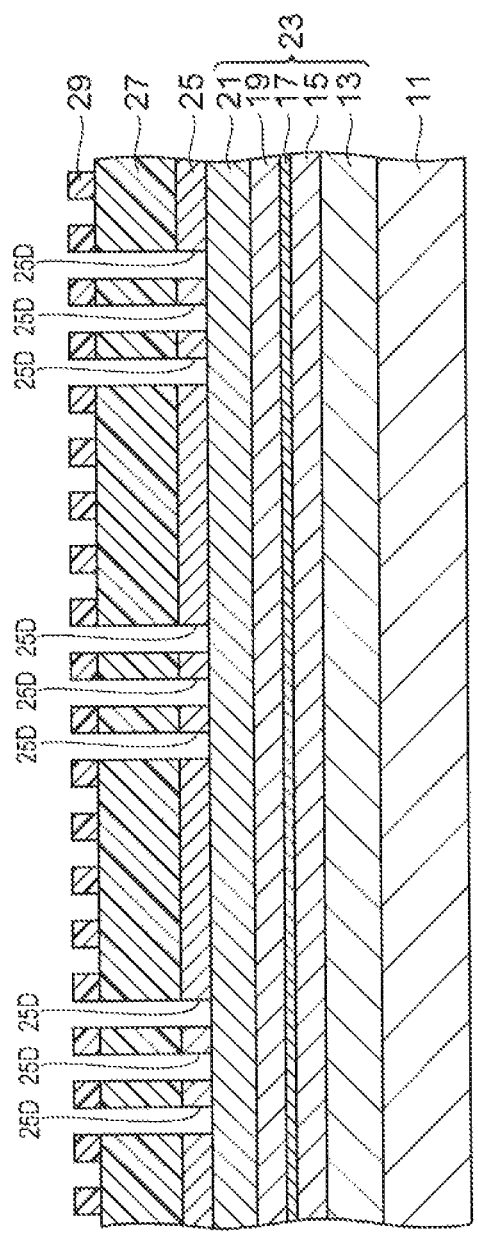
FIG. 16 is a sectional view illustrating a photoresist layer transferring step.
Figure 17:
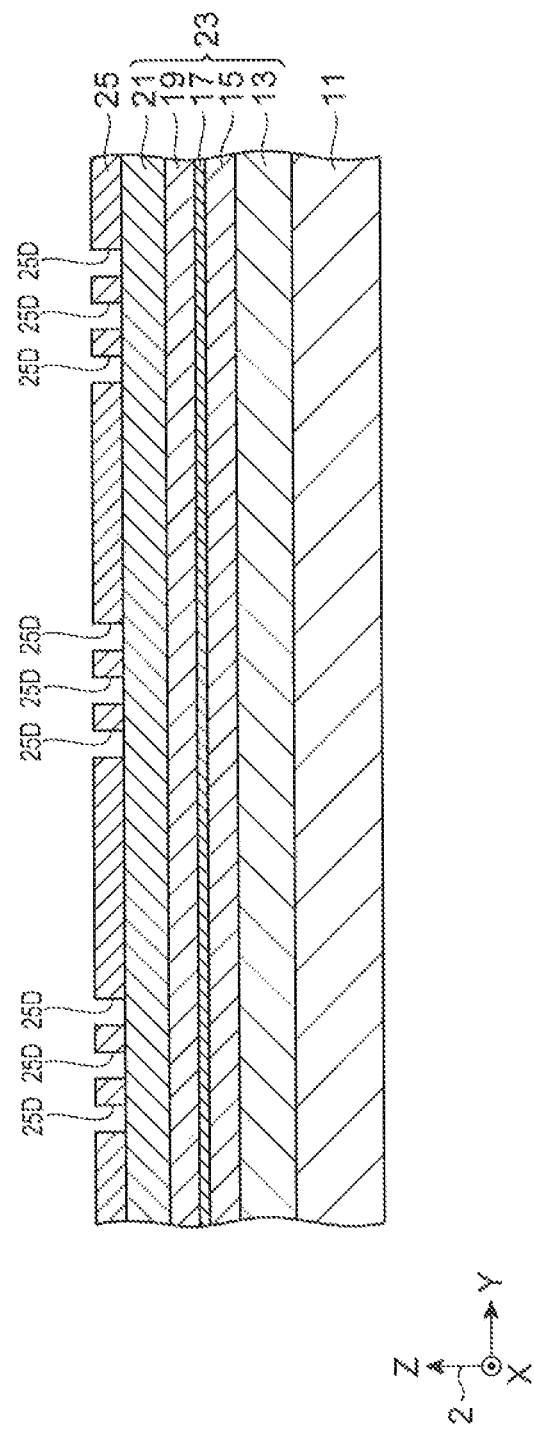
FIG. 17 is a sectional view illustrating the photoresist layer transferring step.

Next, a photoresist layer transferring step is performed. FIGS. 16 to 18 are sectional views illustrating the photoresist layer transferring step. In this step, the shapes of the first areas 27A and the second areas 27B of the photoresist layer 27 are transferred to the semiconductor layer 21.

More specifically, first, as shown in FIG. 16, the transferring layer 25 is selectively etched by, for example, a reactive ion etching (RIE) method using tetrafluoromethane ($CF_4$) gas as an etching gas. In this etching process, the patterned photoresist layer 27 is used as an etching mask. This causes the shape of the photoresist layer 27 to be transferred to the transferring layer 25. A plurality of recesses 25D that define line-and-space patterns are formed in the transferring layer 25.

Next, as shown in FIG. 17, for example, by plasma ashing using oxygen ($O_2$) gas, the photoresist layer 27 and the resin portion 29 are removed. Then, as shown in FIG. 18, the semiconductor layer 21 is etched by, for example, a reactive ion etching (RIE) method using a gas mixture of methane ($CH_4$) and hydrogen ($H_2$) as an etching gas. In this etching process, the transferring layer 25 is used as an etching mask. A plurality of recesses 21D are formed in the semiconductor layer 21. Thereafter, the transferring layer 25 is removed by a wet etching technique using hydrofluoric acid, for example.

In the photoresist layer transferring step, portions without diffraction grating 21A having shapes corresponding to those of the first areas 27A of the photoresist layer 27 (see FIG. 15) are formed in the semiconductor layer 21. Further, diffraction grating portions 21B having shapes corresponding to those of the second areas 27B of the photoresist layer 27 (see FIG. 15) are formed in the semiconductor layer 21. As a result, the sampled grating 21P is formed in the semiconductor layer 21. At this time, the sampled grating 21P includes the portions without diffraction grating 21A and the diffraction grating portions 21B that are alternately provided along the Y axis.

In the first embodiment, line-and-space patterns defined by the plurality of recesses 21D in each diffracting grating portion 21B of the sampled grating 21P correspond to the inverted shapes of the line-and-space patterns 3P defined by the plurality of recesses 3 in the pattern surface 1P of the mold 1.

When the transferring layer 25 is not formed in the resin portion forming step, for example, the semiconductor layer 21 is etched by a reactive ion etching (RIE) method using a gas mixture of methane ($CH_4$) and hydrogen ($H_2$), with the photoresist layer 27 shown in FIG. 15 serving as a mask. Thereafter, for example, by plasma ashing using oxygen ($O_2$) gas, the photoresist layer 27 and the resin portion 29 are removed. As shown in FIG. 18, the sampled grating 21P is formed on the semiconductor layer 21.

After the above-described steps are performed, the method of forming a sampled grating according to the first embodiment ends.

Mesa Portion Forming Step and Electrode Forming Step

Figure 19:
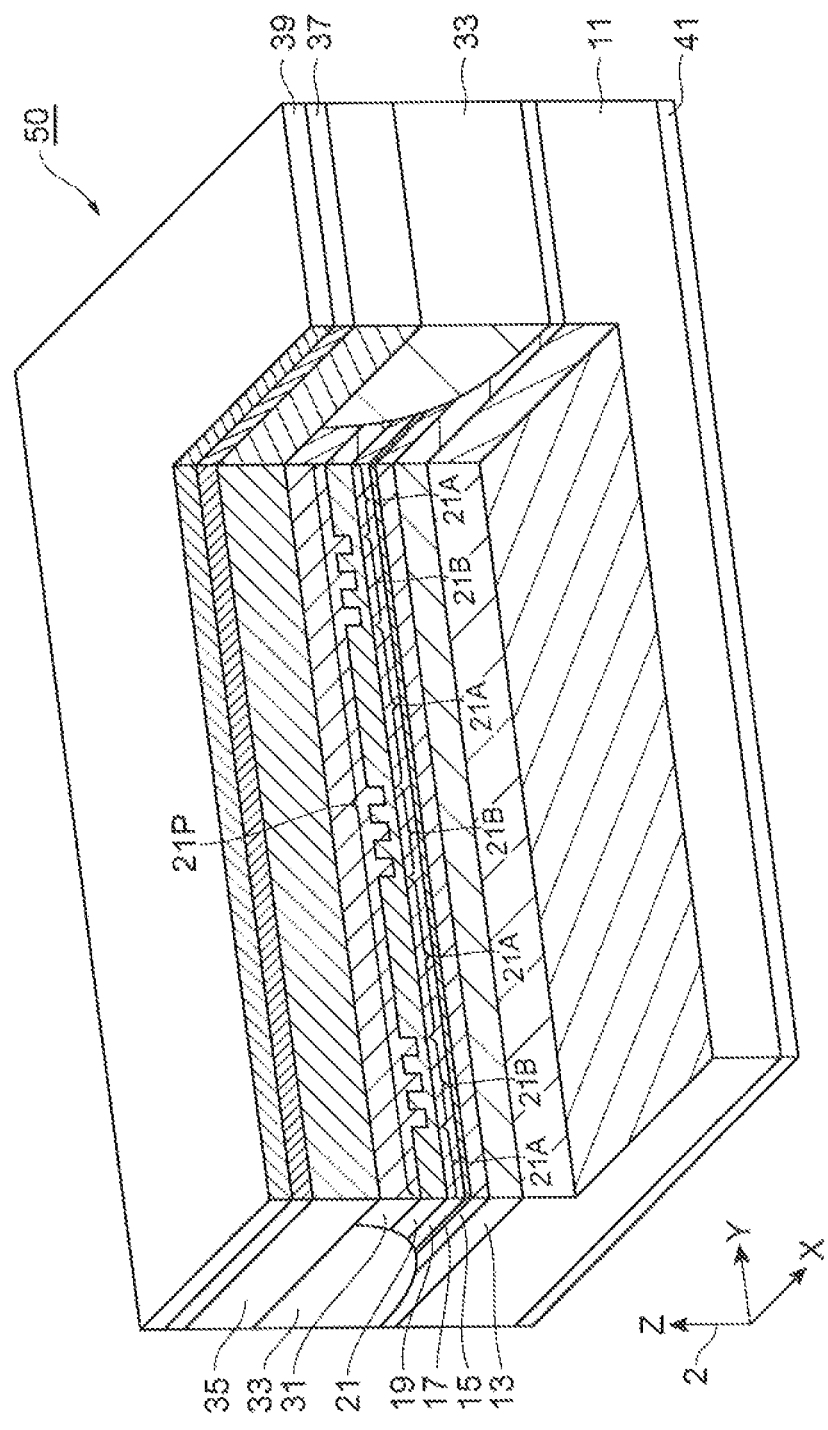
FIG. 19 is a partial cutaway perspective view illustrating a mesa portion forming step and an electrode forming step.

Next, the mesa portion forming step and the electrode forming step are performed. In these steps, first, as shown in FIG. 19, an embedding layer 31 is formed on the semiconductor layer 21 having the sampled grating 21P formed thereon by MOVPE. The sampled grating 21P is embedded in the embedding layer 31. The embedding layer 31 is formed of a second conductivity type, III-V group compound semiconductor containing, for example, InP. The embedding layer 31 is formed of a material that is different from that of the semiconductor layer 21. Therefore, the refractive indices of the embedding layer 31 and the semiconductor layer 21 are different from each other. The embedding layer 31 functions as a first upper cladding layer.

Thereafter, the embedding layer 31, the semiconductor layer 21, the upper optical confinement layer 19, the active layer 17, the lower optical confinement layer 15, and the lower cladding layer 13 are etched by, for example, the wet etching technique. Then, a semiconductor mesa is formed. The semiconductor mesa has a form that protrudes along the Z axis direction and that extends along the Y axis direction. Further, a buried layer 33 in which the semiconductor mesa is embedded is formed. Then, a second upper cladding layer 35 is formed on the buried layer 33 and the embedding layer 31. The buried layer 33 is formed of a semi-insulating III-V group compound semiconductor containing, for example, iron (Fe)-doped InP. The buried layer 33 may have a buried structure in which a second conductivity type, III-V group compound semiconductor layer containing, for example, InP (a first blocking layer) and a first conductivity type, III-V group compound semiconductor layer containing, for example, InP (a second blocking layer) are stacked in that order. The second upper cladding layer 35 is formed of, for example, a second conductivity type, III-V group compound semiconductor containing, for example, InP. The second upper cladding layer 35 need not be formed.

Thereafter, a contact layer 37 and an upper electrode 39 are formed in that order on the second upper cladding layer 35. The contact layer 37 is formed of, for example, a second conductivity type, III-V group compound semiconductor containing, for example, gallium indium arsenide (GaInAs). The upper electrode 39 has a stacked structure formed of, for example, titanium (Ti)/platinum (Pt)/gold (Au). A lower electrode 41 is formed on the back surface of the semiconductor substrate 11. The lower electrode 41 is formed of, for example, a gold-germanium-nickel (AuGeNi) alloy. By performing each of the above-described steps, a distributed feedback laser diode 50 including the sampled grating 21P is produced.

In the embodiment, the masks 7 having different structures and prepared in the mask preparing step are used. Using the masks 7, sampled gratings 21P having different structures can be formed on the semiconductor layer 21 by performing each of the above-described steps. In addition, it is possible to produce distributed feedback laser diodes 50 including the sampled gratings 21P having different structures.

In the method of forming a sampled grating according to the above-described first embodiment, the length of each diffraction grating portion 21B and the length of each portion without diffraction grating 21A along a direction in which the sampled gratings 21P is periodically provided (that is, Y-axis) can be controlled on the basis of the structure of the mask 7. More specifically, the structure of the sampled grating 21P is controlled on the basis of the width W7T of each light transmitting portion 7T of the mask 7 along the direction 7C and the length B7T from one light transmitting portion 7T to another light transmitting portion 7T adjacent thereto (see FIGS. 5 and 18). Therefore, if a plurality of masks 7 having a plurality of structures are prepared, it is possible to form sampled gratings 21P having a plurality of structures using one type of mold 1. The period of the plurality of light transmitting portions 7T of the masks 7 in the direction 7C is greater than the period of the plurality of recesses 3 of the mold 1 in the direction 3C. Therefore, the production cost of the masks 7 can be made lower than the production cost of the mold 1. Therefore, according to the method of forming a sampled grating according to the first embodiment, it is possible to form sampled gratings 21P having various structures at a low cost.

Further, in the partial exposing step of the method of forming a sampled grating according to the first embodiment, first, the photoresist layer 27 and mask 7 are caused to oppose each other. Thereafter, the adjusting step is performed. In the adjusting step, the relative position between the mask 7 and the resin portion 29 is adjusted so that the direction 7C of the mask 7 is parallel to or approaches a direction that is parallel to the direction 29C of the resin portion 29 (see FIGS. 12 and 13). Here, the direction 7C is the direction in which the light transmitting portions 7T of the mask 7 are periodically provided. The direction 29C is the direction in which the plurality of recesses 29D of the resin portion 29 are periodically provided.

This partial exposing step suppresses deviations of the practical diffraction grating period and the number of recesses 21D in each diffraction grating portion 21B of the sampled grating 21P from desired numbers and values.

In the method of producing a laser diode according to the first embodiment, the sampled gratings 21P having various structures can be formed at a low cost. Therefore, according to the method of producing a laser diode according to the first embodiment, a plurality of distributed feedback laser diodes 50 including the sampled gratings 21P having various structures can be produced at a low cost (see FIG. 19).

Second Embodiment

Next, a method of forming a sampled grating and a method of producing a laser diode according to a second embodiment will be described. The method of forming a sampled grating and the method of producing a laser diode according to the second embodiment differ from the corresponding methods according to the first embodiment in that the methods according to the second embodiment each further include a light shield layer etching step. Furthermore, the method of forming a sampled grating and the method of producing a laser diode according to the second embodiment differ from the corresponding methods according to the first embodiment in the resin portion forming step, the nano-imprinting step, the partial exposing step, and the photoresist layer transferring step. The differences between the first and second embodiments will hereunder be primarily described. What are not particularly described are the same as those in the first embodiment.

Resin Portion Forming Step

Figure 20:
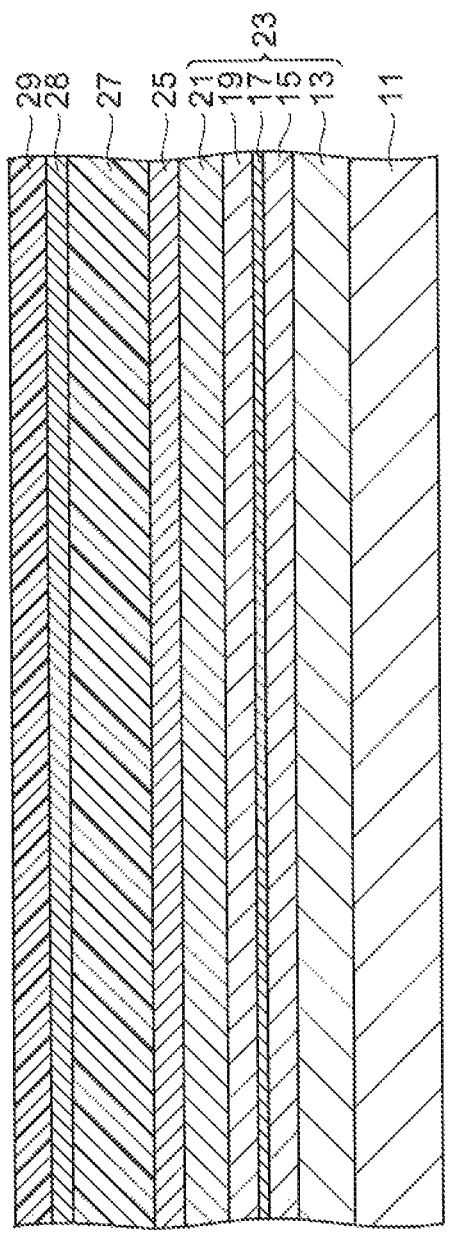
FIG. 20 is a sectional view illustrating a resin portion forming step according to a second embodiment.

FIG. 20 is a sectional view illustrating the resin portion forming step according to the second embodiment. FIG. 20 corresponds to FIG. 6 illustrating the first embodiment. As shown in FIG. 20, in the resin portion forming step according to the second embodiment, a transferring layer 25, a photoresist layer 27, a light shield layer 28, and a resin portion 29 are formed in that order on a semiconductor layer 21. The transferring layer 25 and the photoresist layer 27 according to the second embodiment are formed of the same materials as the transferring layer 25 and the photoresist layer 27 according to the first embodiment. The light shield layer 28 is formed of a material that reflects and/or absorbs ultraviolet (UV) rays (described later). For example, the light shield layer 28 is formed of a metallic material such as aluminum (Al), nickel (Ni), or chromium (Cr), or a metal-oxide material such as titanium dioxide ($TiO_2$). The resin portion 29 according to the second embodiment is formed of resin (ultraviolet (UV) curing resin) that is hardened by utilizing photopolymerization using ultraviolet energy, including, for example, prepolymers, monomers, photopolymerization initiators, and additives. Representative types of ultraviolet curing resin are acrylic resin and epoxy resin.

Nano-Imprinting Step

Figure 21:
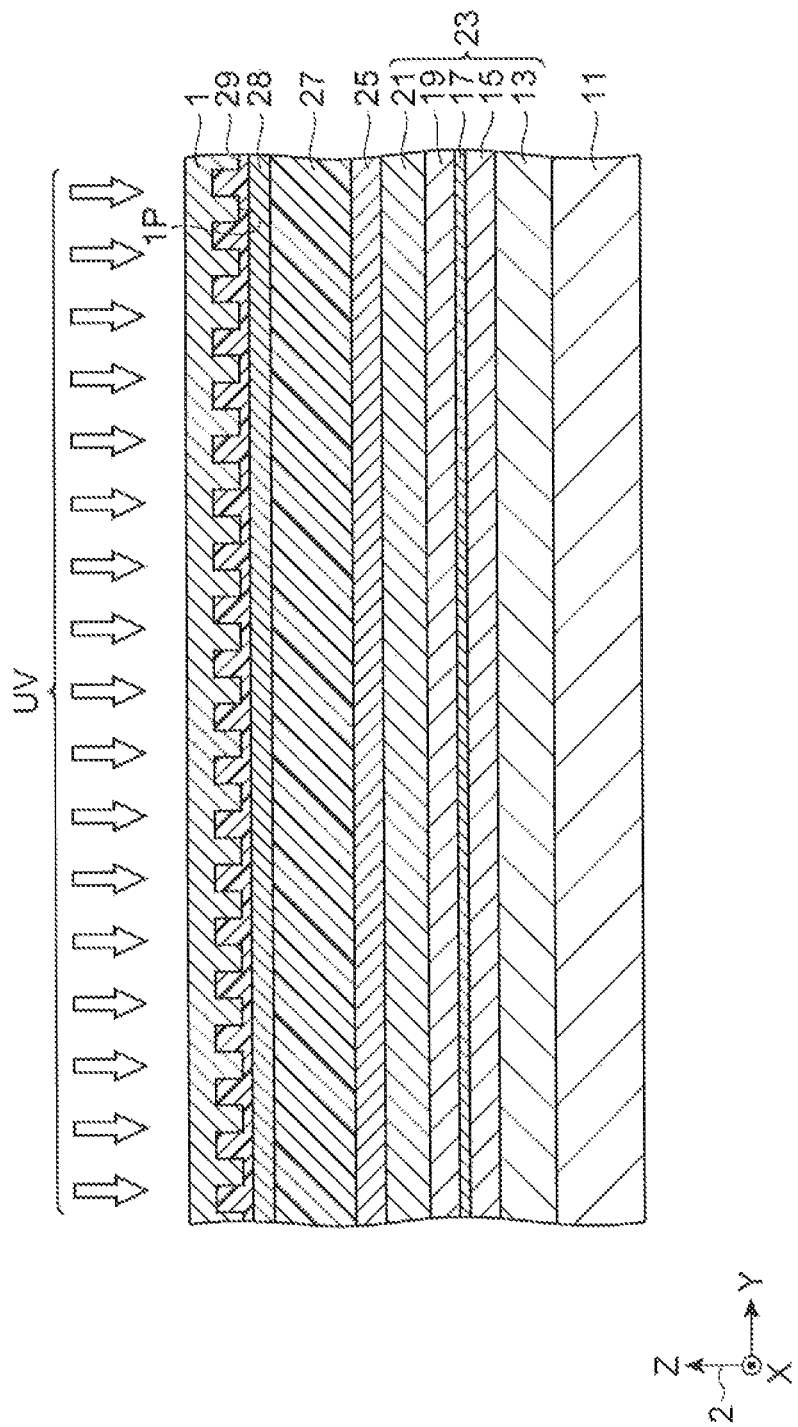
FIG. 21 is a sectional view illustrating a nano-imprinting step according to the second embodiment.
Figure 22:
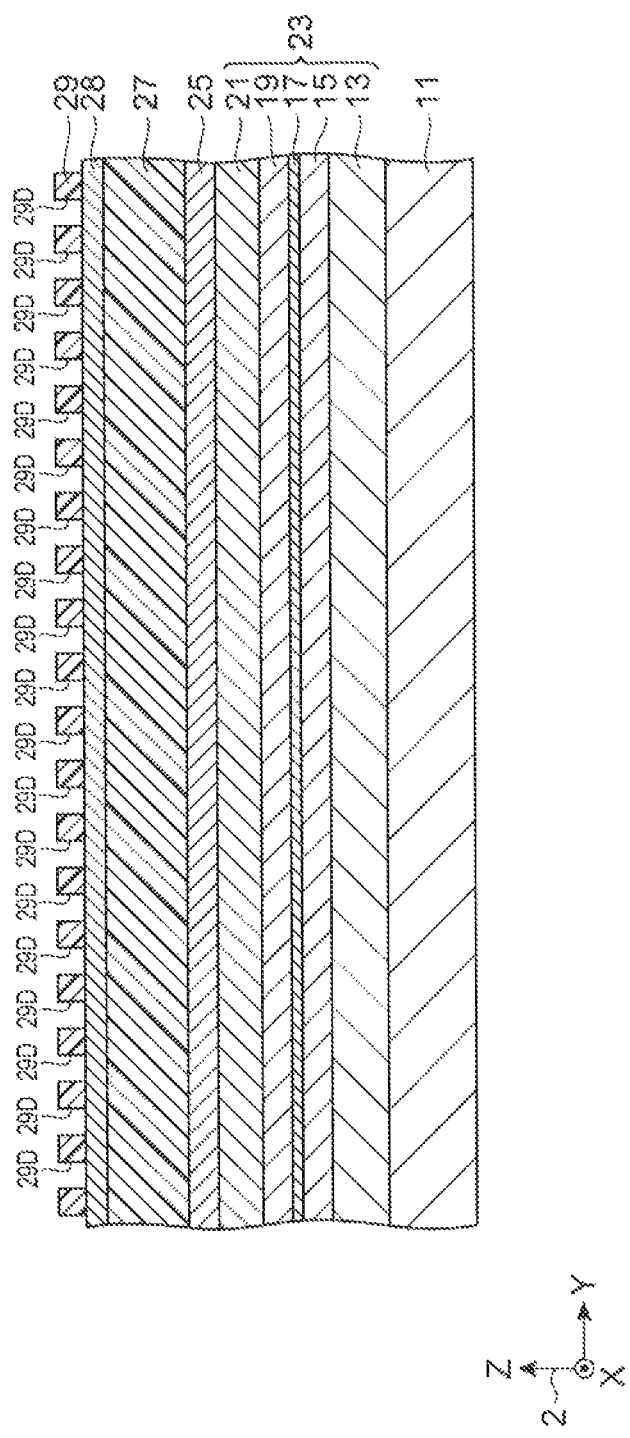
FIG. 22 is a sectional view illustrating the nano-imprinting step according to the second embodiment.

FIGS. 21 and 22 are each a sectional view illustrating the nano-imprinting step according to the second embodiment. FIGS. 21 and 22 correspond, respectively, to FIGS. 7 and 9 illustrating the first embodiment. In the nano-imprinting step according to the second embodiment, the shapes of a plurality of recesses 3 of a mold 1 are transferred to the resin portion 29 by an optical nano-imprinting method. More specifically, first, as shown in FIG. 21, with a pattern surface 1P of the mold 1 being pressed against the resin portion 29, the resin portion 29 is irradiated with ultraviolet (UV) rays through the mold 1 from above the mold 1. Then, the resin portion 29 is hardened by irradiation with UV rays. During the hardening, since the light shield layer 28 reflects and/or absorbs the ultraviolet (UV) rays, the photoresist layer 27 disposed below the light shield layer 28 is not exposed.

Next, as shown in FIG. 22, the mold 1 is detached from the resin portion 29. Thereafter, by, for example, a reactive ion etching (RIE) method using oxygen ($O_2$) gas, the resin portion 29 is etched so that a plurality of recesses 29D reach the light shield layer 28. Then, the surface of the light shield layer 28 is exposed at the plurality of recesses 29D. Therefore, as in the first embodiment, the plurality of recesses 29D are formed in the resin portion 29.

Light Shield Layer Etching Step

Figure 23:
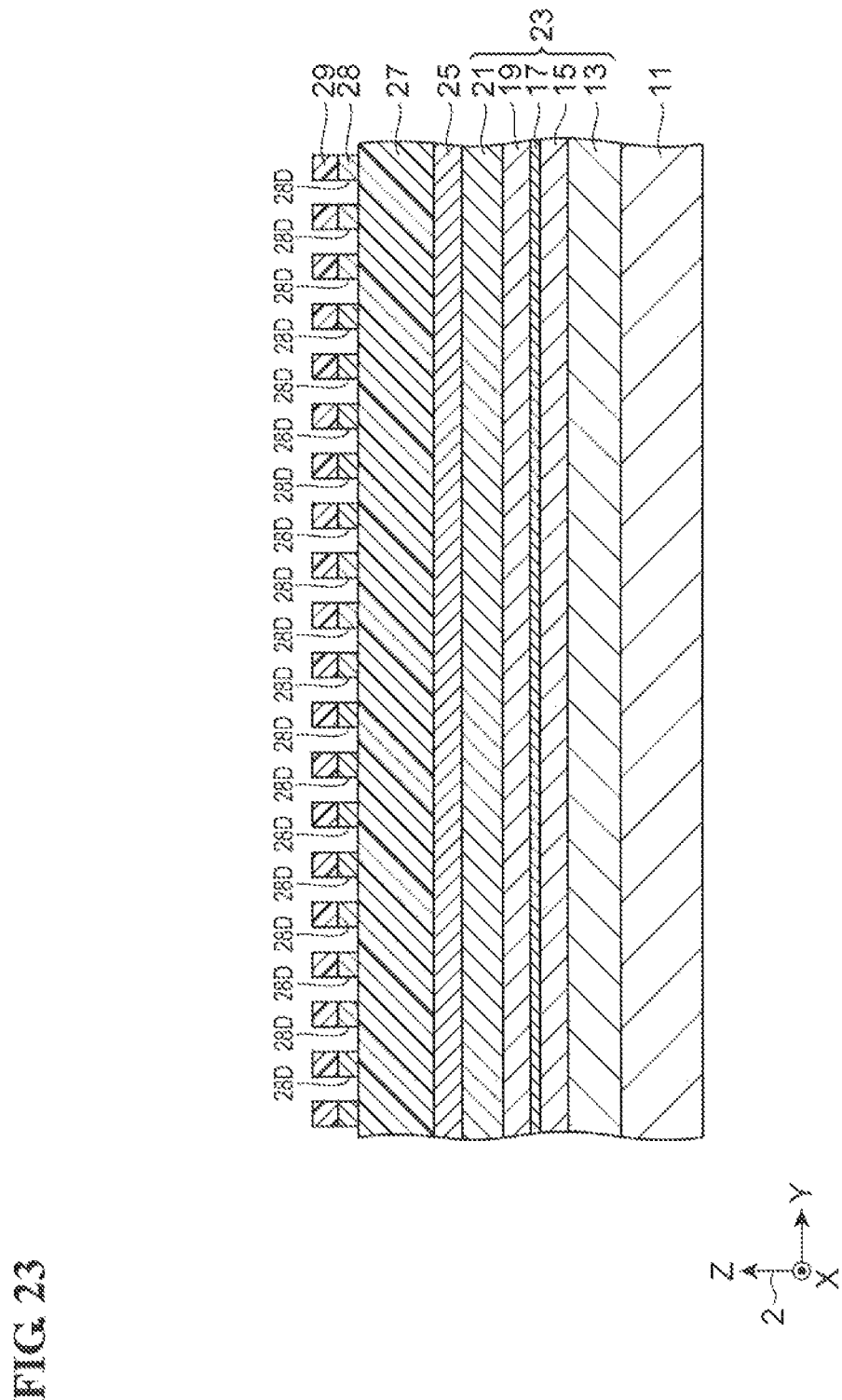
FIG. 23 is a sectional view illustrating a light shield layer etching step according to the second embodiment.

Next, the light shield layer etching step is performed. FIG. 23 is a sectional view illustrating the light shield layer etching step according to the second embodiment. In this step, as shown in FIG. 23, by, for example, a reactive ion etching (RIE) method using chlorine ($Cl_2$) gas, the light shield layer 28 is etched with the resin portion 29 serving as a mask. As a result, the shape of the resin portion 29 is transferred to the light shield portion 28. By this step, the plurality of recesses 28D are formed in the light shield layer 28.

Partial Exposing Step

Figure 24:
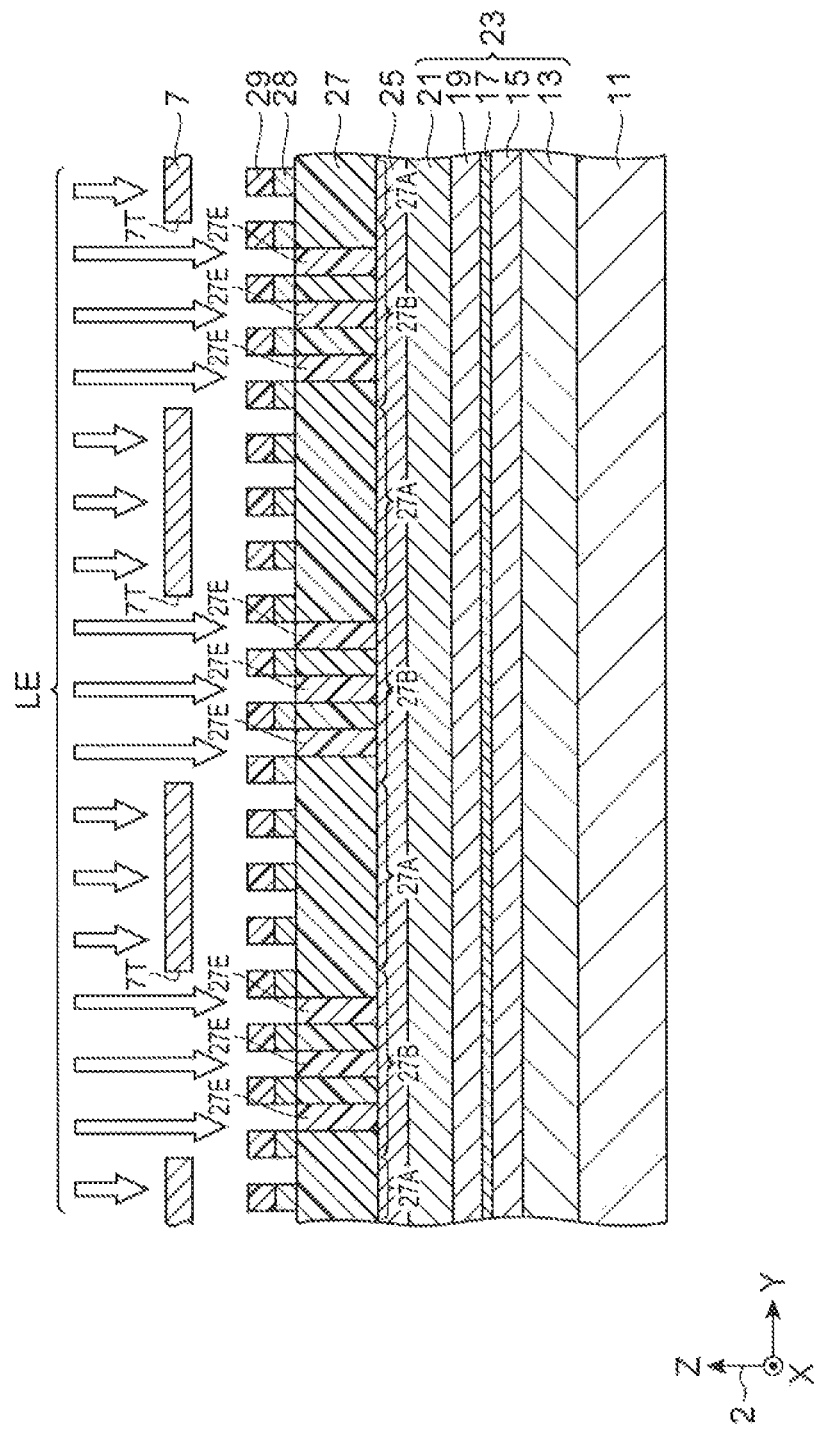
FIG. 24 is a sectional view illustrating a partial exposing step according to the second embodiment.

After the light shield layer etching step, the partial exposing step is performed. FIG. 24 is a sectional view illustrating the partial exposing step according to the second embodiment. FIG. 24 corresponds to FIG. 14 illustrating the first embodiment. In the partial exposure step according to the second embodiment, first, as shown in FIG. 24, the photoresist layer 27 and a surface of a mask 7 are caused to oppose each other through the resin portion 29 and the light shield layer 28. Thereafter, an adjusting step can be performed as in the first embodiment.

As shown in FIG. 24, as in the first embodiment, the photoresist layer 27 is irradiated with exposing light LE through the mask 7. The exposing light LE is transmitted through the plurality of recesses 29D and the plurality of recesses 28D, and reaches the photoresist layer 27. Among second areas 27B of the photoresist layer 27, areas 27E that are below the plurality of recesses 29D of the resin portion 29 are exposed. Here, of the photoresist layer 27, first areas 27A are not exposed. Of the second areas 27B, areas that are covered by the resin portion 29 are not exposed.

Developing Step

Figure 25:
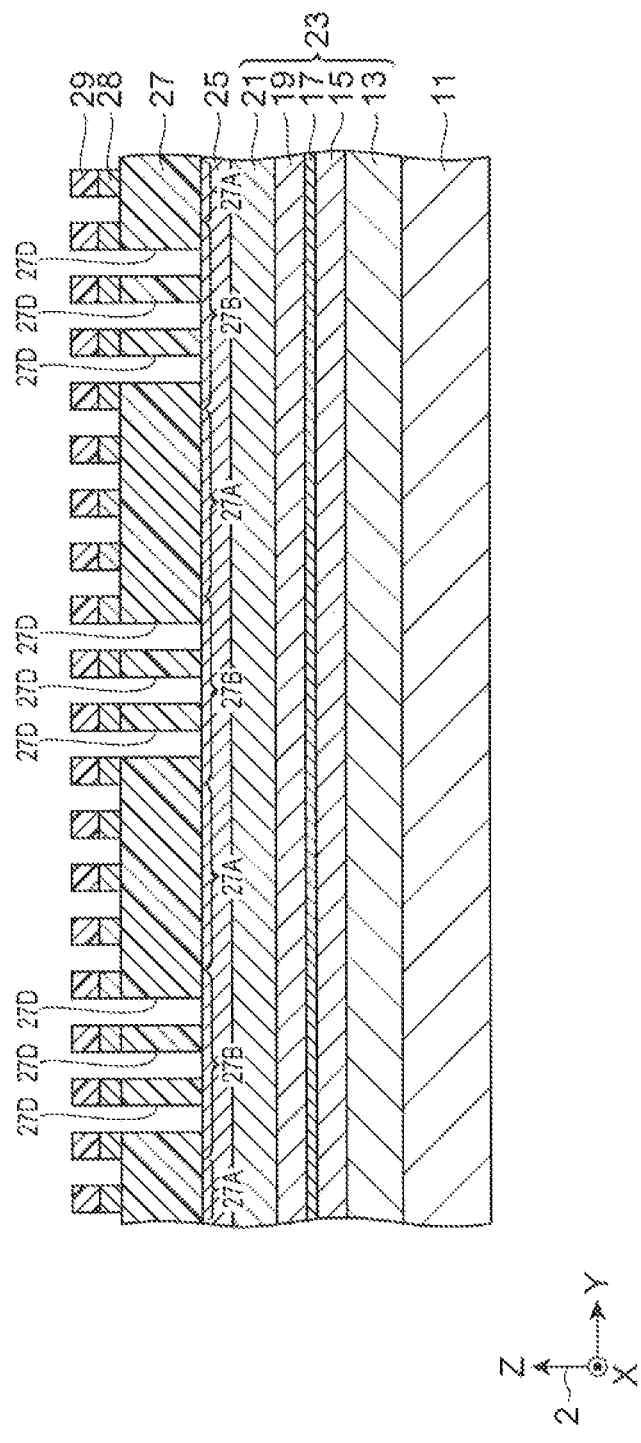
FIG. 25 is a sectional view illustrating a developing step according to the second embodiment.

Next, a developing step is performed. FIG. 25 is a sectional view illustrating the developing step according to the second embodiment. FIG. 25 corresponds to FIG. 15 illustrating the first embodiment. The developing step according to the second embodiment is the same as the developing step according to the first embodiment. That is, the photoresist layer 27 is developed by an alkali developer, to form a plurality of recesses 27D in the second areas 27B of the photoresist layer 27.

Photoresist Layer Transferring Step

Figure 26:
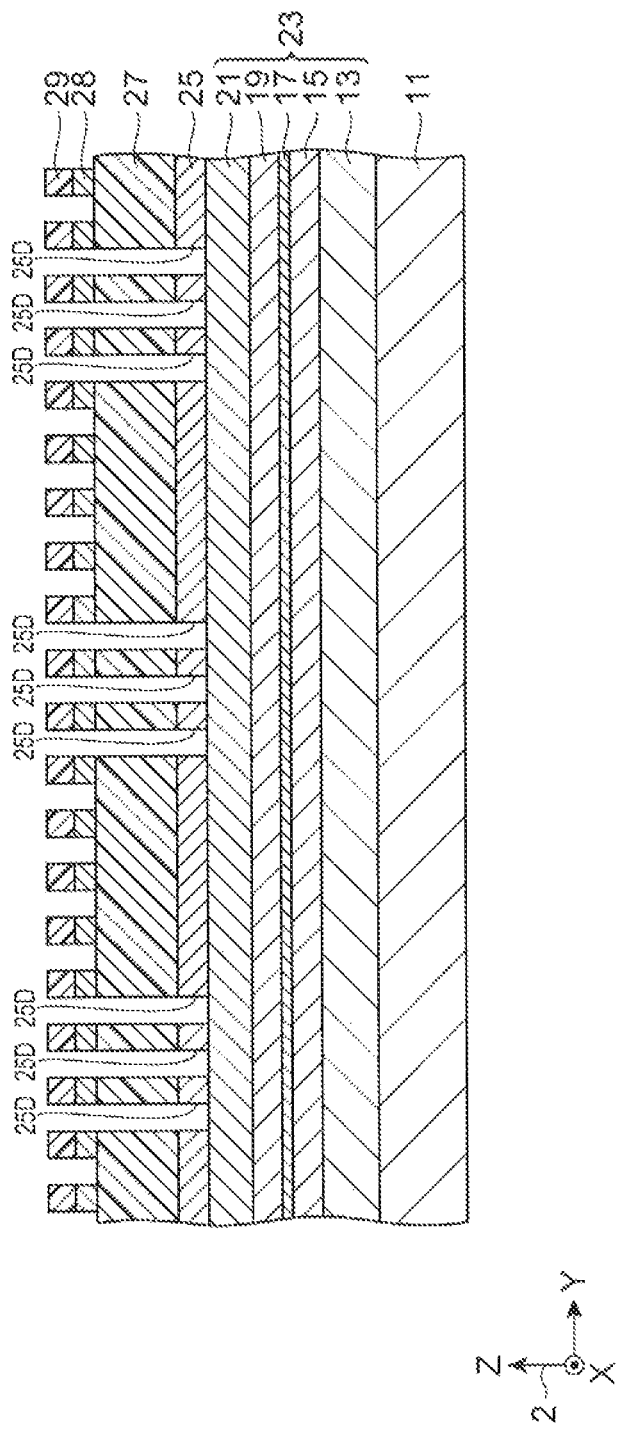
FIG. 26 is a sectional view illustrating a photoresist layer transferring step according to the second embodiment.
Figure 27:
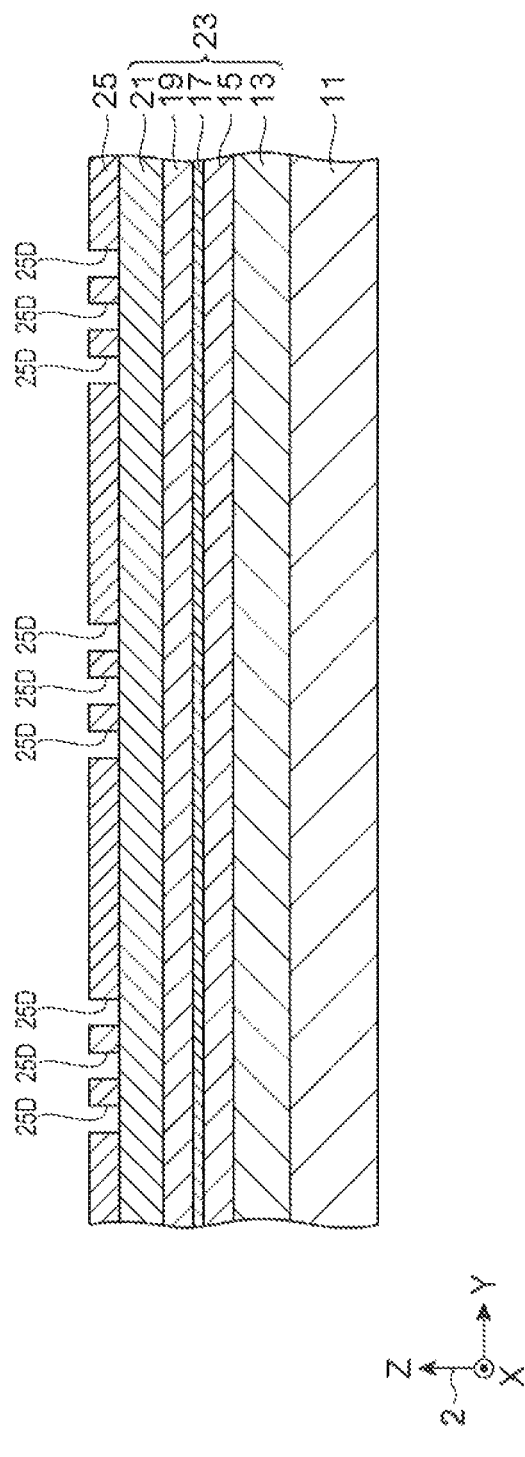
FIG. 27 is a sectional view illustrating a photoresist layer transferring step according to the second embodiment.
Figure 28:
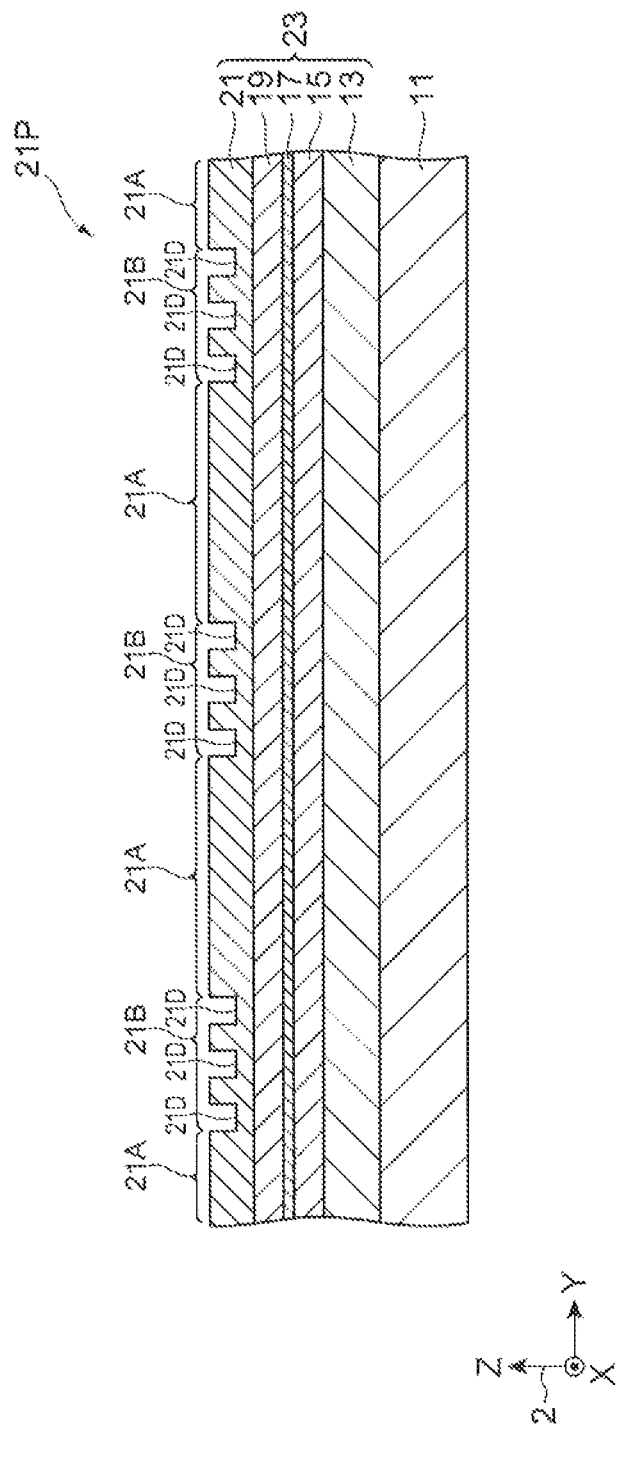
FIG. 28 is a sectional view illustrating the photoresist layer transferring step according to the second embodiment.

Next, the photoresist layer transferring step is performed. FIGS. 26 to 28 are each a sectional view illustrating the photoresist layer transferring step according to the second embodiment. FIGS. 26 to 28 correspond, respectively, to FIGS. 16 to 18 illustrating the first embodiment. In this step, the shapes of the first areas 27A and the second areas 27B of the photoresist layer 27 are transferred to the semiconductor layer 21. More specifically, first, as shown in FIG. 26, as in the first embodiment, the transferring layer 25 is selectively etched, with the photoresist layer 27 serving as a mask. Then, the shape of the photoresist layer 27 is transferred to the transferring layer 25. As a result, a plurality of recesses 25D are formed in the transferring layer 25.

Next, as shown in FIG. 27, for example, by plasma ashing using oxygen ($O_2$) gas, the photoresist layer 27, the light shield layer 28, and the resin portion 29 are removed. Then, as shown in FIG. 28, as in the first embodiment, the semiconductor layer 21 is etched, with the transferring layer 25 serving as a mask. Then, a plurality of recesses 21D are formed in the semiconductor layer 21. Thereafter, by a wet etching technique using, for example, hydrofluoric acid, the transferring layer 25 is removed. By this step, a sampled grating 21P that is similar to that in the first embodiment is formed on the semiconductor layer 21.

Thereafter, as in the first embodiment, a mesa portion forming step and an electrode forming step are performed. Then, a distributed feedback laser diode 50 including the sampled grating 21P is produced (see FIG. 19).

In the method of forming a sampled grating according to the second embodiment, due to the same reasons as in the method of forming a sampled grating according to the first embodiment, it is possible to form sampled gratings 21P having various forms at a low cost.

In the method of producing a laser diode according to the second embodiment, due to the same reasons as in the method of forming a semiconductor laser according to the first embodiment, distributed feedback laser diodes including sampled gratings having various forms can be produced at a low cost (see FIG. 19).

The present invention is not limited to the above-described embodiments, so that various modifications can be made.

For example, in the resin portion forming step in each of the above-described embodiments, a positive photoresist is used as the material of the photoresist layer 27 (see FIG. 6). However, a negative photoresist may be used as this material. In this case, by performing the partial exposing step and the developing step, an inverted pattern of the shape of the resin portion 29 is transferred to the second areas 27B of the photoresist layer 27 (see FIGS. 14 and 15). At this time, line-and-space patterns defined by the plurality of recesses 21D in each diffraction grating portion 21B of the sampled grating 21P correspond to non-inverted shapes of the line-and-space patterns 3P defined by the plurality of recesses 3 in the pattern surface 1P of the mold 1 (see FIG. 18).

Figure 18:
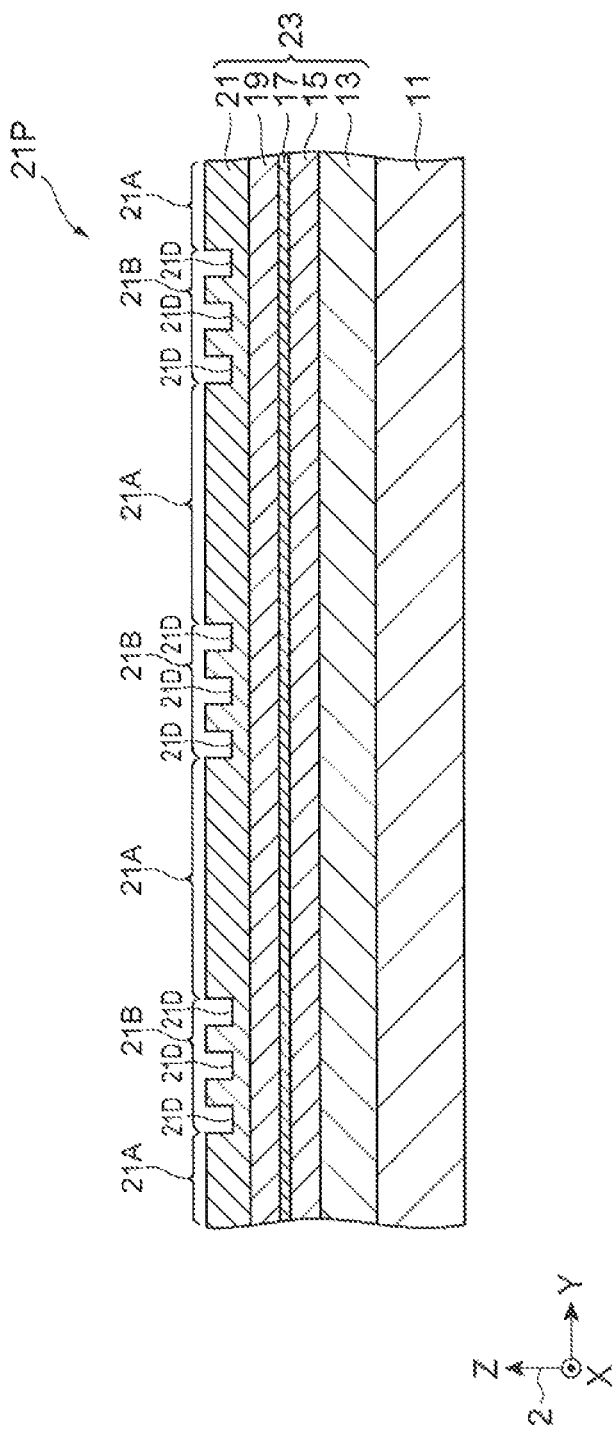
FIG. 18 is a sectional view illustrating the photoresist layer transferring step.

In each of the above-described embodiments, the sampled grating 21P is formed on the semiconductor layer 21 that is provided above the active layer 17 (see FIG. 18). However, the sampled grating 21P may be formed on a layer that is provided below the active layer 17.

Principles of the present invention have been described on the basis of preferred embodiments with reference to the drawings. However, those skilled in the art will understand that the embodiments can be changed in terms of details without departing from the principles. Therefore, all the modifications and changes within the scope and the spirit of Claims are claimed as the present invention.

What is claimed is:

1. A method of forming a sampled grating, comprising the steps of:
    preparing a substrate;
    preparing a nano-imprinting mold including a pattern surface on which projections and recesses are periodically formed;
    preparing a mask including a light obstructing portion and a light transmitting portion that are alternately provided in a first direction;
    forming a photoresist layer and a resin portion in that order on the substrate;
    forming a patterned resin portion having projections and recesses by pressing the pattern surface of the mold into contact with the resin portion and hardening the resin portion while maintaining the contact, the projections and recesses formed on the resin portion being provided in a second direction;
    exposing a portion of the photoresist layer by irradiating the photoresist layer with an exposing light through the mask and the patterned resin portion;
    forming a patterned photoresist layer by developing the photoresist layer, the patterned photoresist layer including a pattern having projections and recesses formed on the portion of the photoresist layer; and
    etching the substrate using the patterned photoresist layer to form a first portion without a pattern having projections and recesses and second portion with a pattern having projections and recesses,
    wherein, in the step of exposing the portion of the photoresist layer, the photoresist layer includes a first area where the exposing light is obstructed by the light obstructing portion of the mask and a second area where the exposing light is transmitted through the light transmitting portion of the mask, and the second area of the photoresist layer is exposed to the exposing light that is transmitted through the recess in the resin portion, and
    wherein, in the step of etching the substrate, the first portion and the second portion are alternately formed, the first portion corresponding to a shape of the first area of the photoresist layer, the second portion corresponding to a shape of the second area of the photoresist layer.

2. The method according to claim 1, wherein, in the step of preparing the mask, a plurality of masks are prepared, each mask including a pattern having the light obstructing portion and the light transmitting portion that are alternately provided in the first direction, the plurality of masks having different patterns from each other, and
    wherein, in the step of exposing the portion of the photoresist layer, one of the masks selected from the plurality of masks is used to expose the portion of the photoresist layer.

3. The method according to claim 2, wherein, each mask includes the light obstructing portion whose length differs from that of the light obstructing portion of each of the other masks along the first direction, or includes the light transmitting portion whose length differs from that of the light transmitting portion of each of the other masks along the first direction.

4. The method according to claim 1, wherein the step of exposing the portion of the photoresist layer includes a step of adjusting a relative position between the mask and the resin portion so that, after the photoresist layer and the mask are caused to oppose each other, the first direction of the mask is parallel to the second direction of the resin portion.

5. The method according to claim 1, wherein the resin portion is formed of thermoplastic resin or thermosetting resin, and
    wherein, in the step of forming the patterned resin portion, the pattern surface having the projections and recesses of the mold is transferred to the resin portion by a thermal nano-imprinting method.

6. The method according to claim 1, wherein the resin portion is formed of ultraviolet curing resin,
    wherein, in the step of forming the photoresist layer and the resin portion, a light shield layer is further formed between the photoresist layer and the resin portion,
    wherein, in the step of forming the patterned resin portion, the pattern surface having the projections and recesses of the mold is transferred to the resin portion by an optical nano-imprinting method,
    wherein the method further comprises a step of forming a patterned light shield layer having projections and recesses by etching the light shield layer with the patterned resin portion serving as a mask, and
    wherein, in the step of exposing the portion of the photoresist layer, the portion of the photoresist layer is exposed by irradiating the photoresist layer with the exposing light through the mask, the patterned resin portion, and the patterned light shield layer.

7. The method according to claim 1, wherein, in the step of forming the photoresist layer and the resin portion on the substrate, a transferring layer is formed between the substrate and the photoresist layer, the transferring layer being formed of a dielectric film, wherein the method further comprises a step of forming a patterned transferring layer having projections and recesses by etching the transferring layer with the patterned photoresist layer serving as a mask, and wherein, in the step of etching the substrate, the substrate is etched using the patterned transferring layer.

8. The method according to claim 1, wherein the step of preparing the substrate includes a step of forming a stacked semiconductor layer on the substrate, the stacked semiconductor layer including a semiconductor layer on which the sampled grating is formed.

* * * * *